United States Patent
Lue

(10) Patent No.: US 9,287,291 B2
(45) Date of Patent: *Mar. 15, 2016

(54) MULTIPLE-BIT-PER-CELL, INDEPENDENT DOUBLE GATE, VERTICAL CHANNEL MEMORY HAVING SPLIT CHANNEL

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/852,997

(22) Filed: Sep. 14, 2015

(65) Prior Publication Data

US 2016/0005762 A1 Jan. 7, 2016

Related U.S. Application Data

(63) Continuation of application No. 14/471,788, filed on Aug. 28, 2014, now Pat. No. 9,147,468, which is a continuation-in-part of application No. 14/284,306, filed on May 21, 2014.

(51) Int. Cl.
*H01L 27/115* (2006.01)
*G11C 11/56* (2006.01)
(Continued)

(52) U.S. Cl.
CPC ...... *H01L 27/11582* (2013.01); *G11C 11/5671* (2013.01); *G11C 16/10* (2013.01); *H01L 23/528* (2013.01); *H01L 27/1157* (2013.01); *H01L 29/511* (2013.01); *G11C 16/0458* (2013.01)

(58) Field of Classification Search
CPC ........... G11C 11/5671; G11C 16/0458; G11C 16/0483; H01L 27/1157; H01L 27/11582; H01L 23/528; H01L 29/511
USPC .................... 365/185.03, 63, 72, 130, 185.11
See application file for complete search history.

(56) References Cited

U.S. PATENT DOCUMENTS

| 7,714,377 B2 * | 5/2010 | Specht ............... G11C 16/0483 257/316 |
| 8,013,383 B2 | 9/2011 | Kidoh et al. |

(Continued)

OTHER PUBLICATIONS

Arya, Pranav, "3D Nand Flash Memory,"IEE5008 Memory Systems,—Autumn 2012, 43 pages. In accordance with MPEP 609.04 (a), the year of this publication is sufficiently earlier than the effective U.S. filing date, Sep. 24, 2010, so that the particular month of publication is not an issue. See MPEP 609.04 (a).

(Continued)

*Primary Examiner* — Tan T. Nguyen
(74) *Attorney, Agent, or Firm* — Haynes Beffel & Wolfeld LLP

(57) ABSTRACT

A vertical channel 3D NAND array is configured for independent double gate operation, establishing two memory sites per frustum of a vertical channel column, and in addition, for multiple-bit-per-cell operation. The memory device can comprise even and odd stacks of conductive strips. Active pillars are arranged between corresponding even and odd stacks of conductive strips. A 3D array includes even memory cells accessible via the active pillars and conductive strips in the even stacks and odd memory cells accessible via the active pillars and conductive strips in the odd stacks of conductive strips. Control circuitry is configured to apply different bias voltages to the even and odd conductive strips, and execute a program operation by which more than one bit of data is stored in both the even memory cell and odd memory cell in a given frustum of a selected active strip.

22 Claims, 34 Drawing Sheets

(51) Int. Cl.
*G11C 16/10* (2006.01)
*H01L 29/51* (2006.01)
*H01L 23/528* (2006.01)
*G11C 16/04* (2006.01)

(56) References Cited

U.S. PATENT DOCUMENTS

| | | | |
|---|---|---|---|
| 8,163,616 | B2 | 4/2012 | Kang et al. |
| 8,203,187 | B2 | 6/2012 | Lung et al. |
| 8,208,279 | B2 | 6/2012 | Lue |
| 8,363,476 | B2 | 1/2013 | Lue et al. |
| 8,437,192 | B2 | 5/2013 | Lung et al. |
| 8,467,219 | B2 | 6/2013 | Lue |
| 8,625,322 | B2 | 1/2014 | Samachisa et al. |
| 8,644,077 | B2 | 2/2014 | Lue et al. |
| 8,681,555 | B2 | 3/2014 | Liu |
| 8,853,818 | B2 | 10/2014 | Lue |
| 8,917,557 | B2 | 12/2014 | Sakaguchi et al. |
| 9,147,468 | B1 * | 9/2015 | Lue ............... G11C 11/5671 |
| 2009/0184360 | A1 | 7/2009 | Jin et al. |
| 2010/0020617 | A1 | 1/2010 | Oh et al. |
| 2010/0155818 | A1 | 6/2010 | Cho et al. |
| 2011/0298037 | A1 * | 12/2011 | Choe ............... G11C 16/0483 257/324 |
| 2012/0068241 | A1 | 3/2012 | Sakuma et al. |
| 2012/0182806 | A1 | 7/2012 | Chen et al. |
| 2012/0299086 | A1 | 11/2012 | Lee |
| 2012/0327714 | A1 * | 12/2012 | Lue ............... G11C 5/02 365/185.17 |
| 2013/0313627 | A1 | 11/2013 | Lee et al. |
| 2014/0001530 | A1 | 1/2014 | Song |
| 2014/0198570 | A1 | 7/2014 | Hsieh et al. |
| 2014/0231954 | A1 | 8/2014 | Lue |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology(VLSIT), pp. 91-92.

Choi et al., "3D approaches for non-volatile memory", 2011 Symposium on VLSI Technology, Digest of Technical Papers, pp. 178-179, Jun. 14-16, 2011.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf, 29 pages.

* cited by examiner

US 9,287,291 B2

MULTIPLE-BIT-PER-CELL, INDEPENDENT DOUBLE GATE, VERTICAL CHANNEL MEMORY HAVING SPLIT CHANNEL

RELATED APPLICATIONS

This application is a continuation of U.S. patent application Ser. No. 14/471,788 (now U.S. Pat. No. 9,147,468); which application is a continuation-in-part of co-pending application Ser. No. 14/284,306, filed on 21 May 2014, which application is incorporated by reference as if fully set forth herein.

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around the cell at each layer.

Katsumata et al. has suggested that the structure can be implemented using multiple-bit-per-cell programming technologies. These multiple-bit-per-cell programming technologies require fine control over threshold voltages, making read and program disturb characteristics even more critical. Therefore, even with high density three-dimensional flash technologies, the density of data storage can be limited.

Because of the relatively large cross-section of the column and dielectric charge trapping structure used to limit disturbance, the density of the three-dimensional memory structure is limited.

It is desirable to provide a structure for three-dimensional integrated circuit memory with a low manufacturing cost, including reliable, very small memory elements, and high data densities.

SUMMARY OF THE INVENTION

A vertical channel 3D NAND array is described, configured for independent double gate operation, establishing two memory sites per frustum of a vertical channel column, and configured, in addition, for multiple bit per site operation. In an example described herein, the memory device comprises a plurality of stacks of conductive strips, the plurality of stacks including even stacks and odd stacks. A plurality of active pillars arranged between corresponding even and odd stacks of conductive strips in the plurality of stacks, defines a multilayer array of interface regions at cross-points between opposing side surfaces of the active pillars and conductive strips in the corresponding even and odd stacks of conductive strips. A 3D array of even memory cells in the interface regions, accessible via the active pillars and conductive strips in the even stacks of conductive strips and odd memory cells in the interface regions, is accessible via the active pillars and conductive strips in the odd stacks of conductive strips. Control circuitry is configured to apply different bias voltages to the even and odd conductive strips, and to execute a program operation by which more than one bit of data is stored in both, or at least one of, the even memory cell and odd memory cell in a given frustum of a selected active strip.

The odd memory cells on a given active pillar can be configured as a first NAND string, and the even memory cells on said given active pillar can be configured as a second NAND string. The active pillars can comprise a vertical channel structure including a seam, at least in the regions between the even and odd memory cells in a given frustum of the active pillar.

In a dual NAND string embodiment, the conductive strips in an upper level in the even and odd stacks can be configured as string select lines for both the first and second NAND strings on a given active pillar. The conductive strips in intermediate levels in the even and odd stacks can be configured as word lines for respective ones of the first and second NAND strings on a given active pillar. The conductive strips in a lower level in the even and odd stacks can be configured as ground select lines for both the first and second NAND strings on a given active pillar.

The memory block structure can include a plurality of reference lines beneath and connected to the corresponding rows of active pillars in the plurality of active pillars. In a device described herein, the conductive strips configured as ground select lines have a thickness such that they overlap with corresponding reference lines and with lower portions of the active pillars in the corresponding rows.

Also, examples are described in which the active pillars comprise a vertical channel structure include a seam at the intermediate levels, and no seam at the upper level.

The plurality of stacks of conductive strips are arranged in blocks and, in a given block, conductive strips in a given layer of an odd stack can be configured in a comb-like structure with strips extending from an odd pad, and conductive strips in a given layer of an even stack can be configured in a comb-like structure with strips extending from an even pad, the conductive strips extending from the odd and even pads in the given block being interdigitated.

A first conductor, such as a strip of metal silicide, can be disposed along one side of a row of blocks connected to even pads in even comb-like structures in the blocks along the row, and a second conductor can be disposed along another side of the row of blocks connected to odd pads in odd comb-like structures in the blocks along the TOW.

The even comb-like structures and said first conductor disposed along one side of a row in a given layer can comprise features of a single patterned semiconductor element, and the odd comb-like structures and said second conductor disposed along the other side of the row in the given layer can comprise features of another single patterned semiconductor element.

Methods for manufacturing memory devices as described herein are also provided.

Other aspects and advantages of the present invention can be seen on review of the drawings, the detailed description and the claims, which follow.

DETAILED DESCRIPTION

A detailed description of embodiments of the present invention is provided with reference to the FIGS. 1-35.

Figure 1:
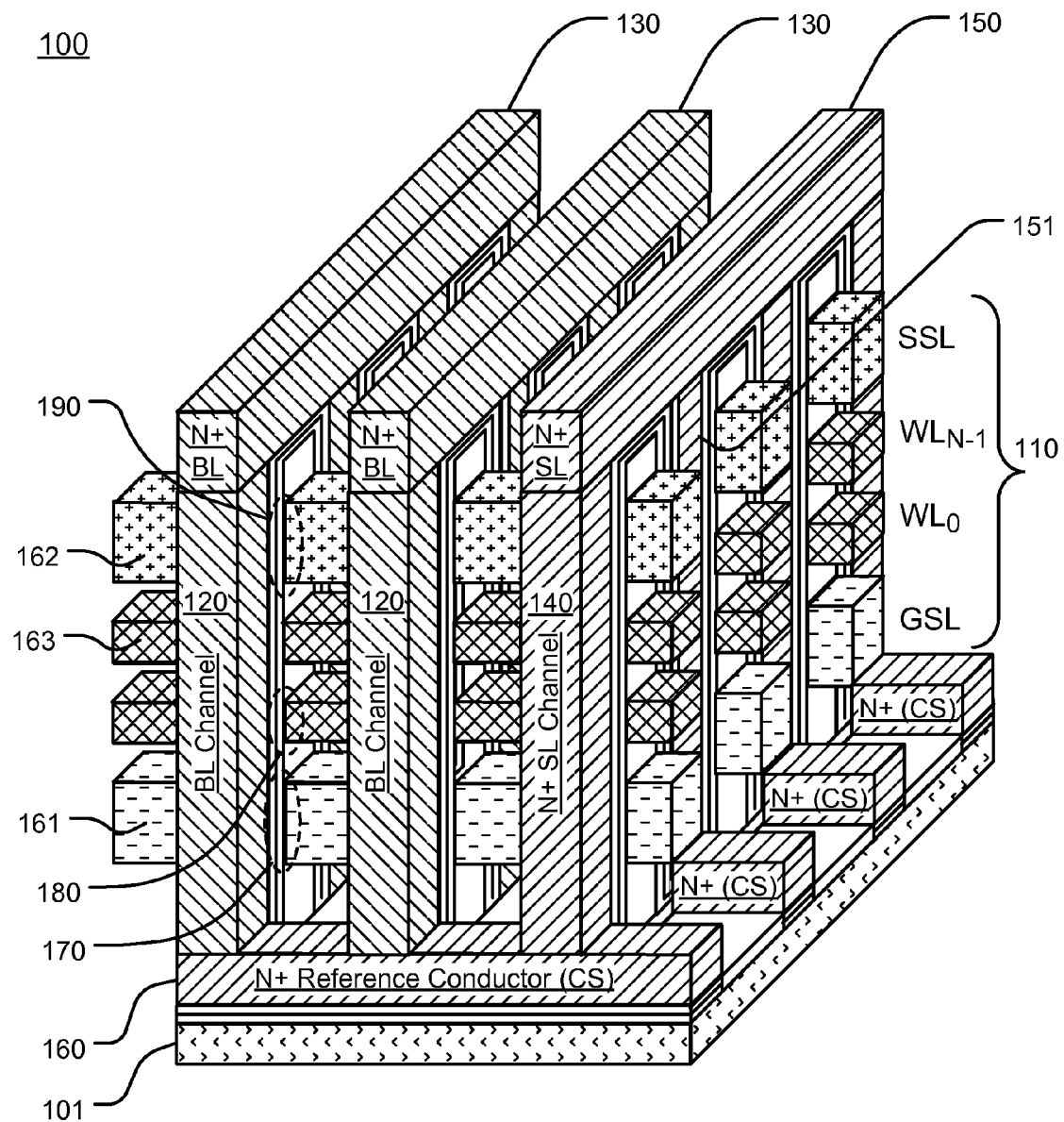
FIG. 1 is a simplified perspective diagram of a 3D memory device.

FIG. 1 is a schematic diagram of a three-dimensional 3D memory device 100 having independent double gate structure. The memory device 100 includes an array of NAND strings of memory cells, configured in an independent double gate vertical channel memory array (IDGVC) with two NAND strings per vertical channel, and suitable for multiple-bit-per-cell data storage. The memory device 100 includes an integrated circuit substrate, and a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 1, a stack 110 includes a bottom plane of conductive strips (GSL), a plurality of intermediate planes of conductive strips (WLs) ranging from WL0 to WLN−1, and a top plane of conductive strips (SSLs), where N can be 8, 16, 32, 64 and so on. Adjacent even word lines WLi and odd word lines WLi+1 are connected to separate bias circuits (not shown), so that two charge storage sites at the frustum of each vertical channel structures between the adjacent word lines can be separately accessed and used for data storage. This arrangement of independent word lines can be implemented for example by connecting even word lines to a first bias structure, and odd word lines to a separate bias structure, examples of which are described below.

The conductive strips acting as word lines, string select lines and ground select lines can comprise a variety materials including doped semiconductors, metals, and conductive compounds like Si, Ge, SiGe, SiC, TiN, TaN, W, and Pt.

Vertical channel structures (e.g. 120) are a part of a bit line structure in the memory device, and can comprise semiconductor materials adapted to act as channels for the memory cells, such materials as Si, Ge, SiGe, GaAs, SiC, and graphene.

The plurality of bit line structures are arranged orthogonally over, and have surfaces conformal with, the plurality of stacks, including inter-stack semiconductor body elements acting a vertical channel structures 120, between the stacks and linking elements 130 over the stacks connecting the inter-stack vertical channel structures 120. The linking elements 130 in this example comprise a semiconductor, such as polysilicon, having a relatively high doping concentration so that they have higher conductivity than the inter-stack vertical channel structures 120, which are configured to provide channel regions for the cells in the stacks. In alternative implementations, the linking elements can be part of overlying patterned metal layers, connected to the vertical channel structures by interlayer connectors or plugs.

The memory device includes charge storage structures in interface regions at cross-points 180 between side surfaces of the even and odd conductive strips in the plurality of intermediate planes (WLs) in the stacks and the inter-stack vertical channel structures 120 of the plurality of bit line structures.

Charge storage structures in the memory device can comprise multilayer dielectric charge trapping structures known from flash memory technologies known in the art as SONOS, BE-SONOS, TANOS, and MA BE-SONOS. In a representative device, the dielectric layer of memory material can include a bandgap engineered composite tunneling dielectric layer comprising a layer of silicon dioxide less than 2 nm thick, a layer of silicon nitride less than 3 nm thick, and a layer of silicon dioxide less than 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields. These layers can be conformally deposited using for example LPCVD.

A charge trapping layer in the layer of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer of memory material in this embodiment comprises a layer of silicon dioxide having a thickness greater than 50 Å, including for example about 90 Å in this embodiment, and can be formed by LPCVD or other wet conversion from the nitride by a wet furnace oxidation process. Other blocking dielectrics can include high-κ materials like aluminum oxide.

The deposition techniques applied to form these layers of BE-SONOS ONO films and channel material can be simply carried out by conventional LPCVD process, which provides excellent film quality and conformality required. On the other hand, tools such as atomic layer deposition ALD tools can be developed for these films.

The combination of a vertical channel structure and its charge storage structures is referred to herein as an active pillar (e.g., active pillar 151). In the illustrated example, the memory cells in the cross-points 180 are configured in vertical NAND strings. In this configuration, two separate NAND strings are established on the opposing sides of a single inter-stack vertical channel structure. The two separate NAND strings can be operated independently for multiple-bit-per-cell, read, erase and program operations.

A reference conductor 160 is disposed between the bottom plane (GSL) of conductive strips and the integrated circuit substrate (not shown). At least one reference line structure is arranged orthogonally over the plurality of stacks, including inter-stack vertical conductive elements 140 between the stacks in electrical communication with the reference conductor 160, and linking elements 150 over the stacks 110 connecting the inter-stack vertical conductive elements 140. The inter-stack vertical conductive elements 140 can be formed using the same material as the vertical channel structures 120, or can alternatively be formed using a material that provides a higher conductivity than the inter-stack vertical channel structures 120.

In the structure shown in FIG. 1, a string select line (e.g. 162) is disposed on each side of each active pillar (e.g. 151). Also, word lines (e.g. 163) are disposed on each side of each active pillar (e.g. 151). In addition, ground select lines (e.g. 161) are disposed on each side of an active pillar (e.g. 151).

The memory device includes string select switches 190 at interface regions with the top plane, or an upper level, of conductive strips, and reference select switches 170 at interface regions with the bottom plane (GSL) of conductive strips. The dielectric layers of the charge storage structure can act as gate dielectric layers for the switches 170, 190 in some examples.

The memory device includes a first overlying patterned conductive layer (not shown) connected to the plurality of bit line structures, including a plurality of global bit lines coupled to sensing circuits. The memory device also includes a second overlying conductive layer (not shown), which can be patterned, and can be above or below the first patterned conductor layer. The second overlying conductive layer is connected to the at least one reference line structure, such as by contact to the linking element 150. The second patterned conductor layer can connect the at least one reference line structure to a reference voltage source, or to circuitry for providing a reference voltage.

In the example shown in FIG. 1, the linking elements 130 of the bit line structures include N+ doped semiconductor material. The inter-stack vertical channel structures 120 of the bit line structures include lightly doped semiconductor material. In the example shown in FIG. 1, the reference conductor 160 includes N+ doped semiconductor material, and the linking elements 150 of the at least one reference line structure include N+ doped semiconductor material. The inter-stack vertical conductive elements 140 of the at least one reference line structure also include N+ doped semiconductor material. In alternative implementations a metal or metal compound can be used in place of the doped semiconductors.

In one embodiment, in order to reduce the resistance of the reference conductor 160, the memory device can include a bottom gate 101 near the reference conductor 160. During read operations, the bottom gate 101 can be turned on by a suitable pass voltage applied to an underlying doped well or wells in the substrate, or other underlying patterned conductor structures, to increase the conductivity of the reference conductor 160.

Figure 2:
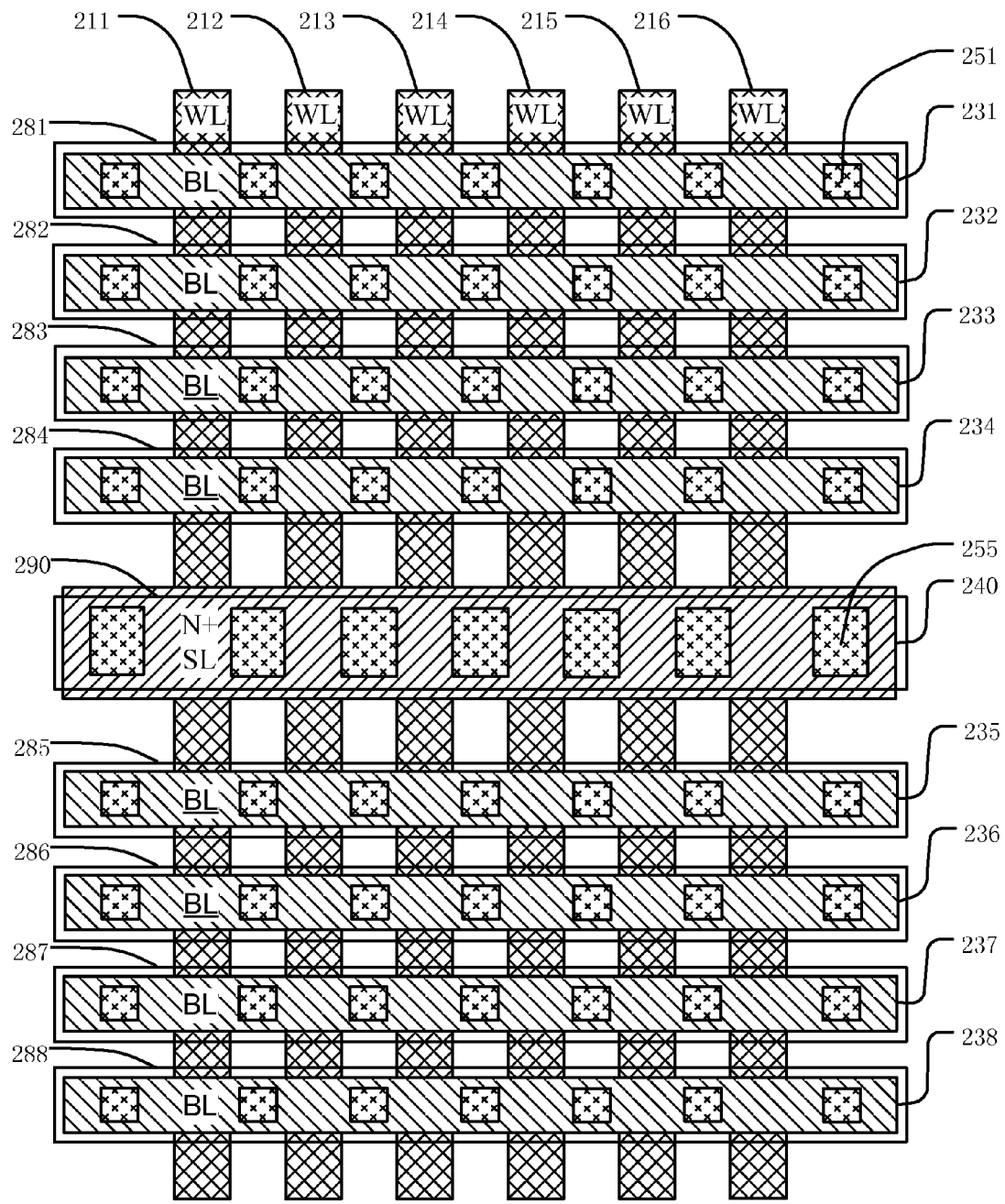
FIG. 2 is a layout view of a 3D structure like that illustrated in FIG. 1.

FIG. 2 is a layout schematic corresponding to a top view of the 3D schematic diagram in FIG. 1. Bit lines 231 through 234, and bit lines 235 through 238 correspond to the linking elements 130 in the plurality of bit line structures (FIG. 1). Source line 240 corresponds to the linking element 150 in the at least one reference line structure (FIG. 1); other source lines can be disposed at intervals along the array. The bit lines (BL) and the source line (SL) are arranged orthogonally over word lines (WL) 211 through 216, which word lines are in the plurality of intermediate planes of conductive strips. Although only four bit lines are shown at each side of the source line 240, there can be any number of bit lines on each side of the source line 240. For instance, there can be eight or sixteen bit lines at each side of the source line 240.

In the example shown in FIG. 2, the memory device includes a first overlying conductive layer, which includes first overlying lines 281-288. The first overlying conductive layer can include metal, doped semiconductor or combinations of materials. The first overlying lines 281-288 are directly connected to the bit lines 231-238 via bit line contacts 251 to minimize bit line loading resistance. As described herein, bit lines 231-238 correspond to the linking elements 130 in the plurality of bit line structures (FIG. 1), thus the first overlying conductive layer is connected to the plurality of bit line structures. The bit line structures can include a plurality of global bit lines coupled to sensing circuits (not shown). Locations of bit line contacts 251 are representative of one example. The physical layout of bit line contacts can be periodic or aperiodic, where more regular layouts can provide for better lithography exposure.

In the example shown in FIG. 2, the memory device includes a second overlying layer 290. The second overlying conductive layer can include metal, doped semiconductor or combinations of materials. The second overlying layer 290 is directly connected to the source line 240 via source line contacts 255 to minimize source line loading resistance. As described herein, the source line 240 corresponds to the linking element 150 in the at least one reference line structure (FIG. 1), thus the second overlying conductive layer is connected to the at least one reference line structure. The second overlying conductive layer can be coupled to a reference voltage source (not shown). Locations of source line contacts 255 are representative of one example. The physical layout of source line contacts can be periodic or aperiodic, where more regular layouts can provide for better lithography exposure.

The inter-stack vertical conductive elements 140 (FIG. 1) in the at least one reference line structure can have a larger cross-sectional area than the inter-stack vertical channel structures 120 (FIG. 1) in the bit line structures. Correspondingly, source line contacts 255 can have a larger cross-sectional area than bit line contacts 251.

Figure 3:
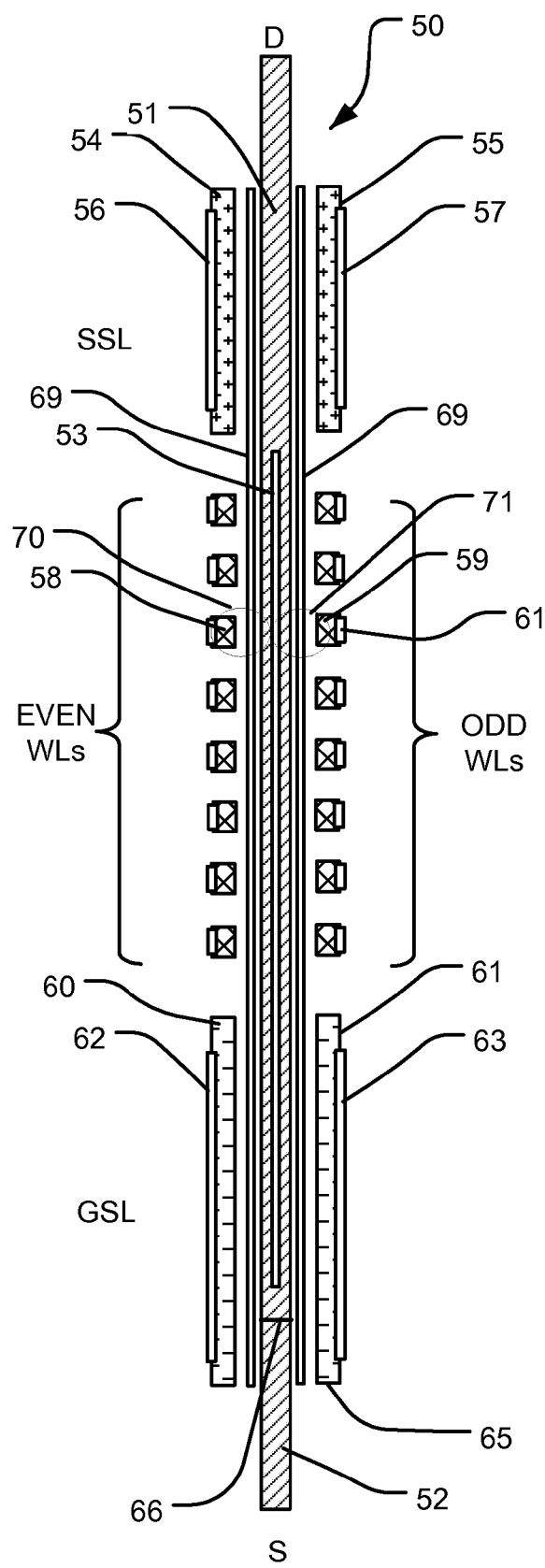
FIG. 3 is a heuristic cross-section of an active pillar in a 3D memory device.

FIG. 3 is a cross-section of an active pillar, such as the active pillar 151 of FIG. 1, with adjacent string select lines, ground select lines, even word lines and odd word lines. The active pillar in FIG. 3 includes a vertical channel structure 50, including a vertical polysilicon semiconductor body, and a charge storage element 69 on each side or surrounding the semiconductor body. The vertical channel structure 50 includes a portion 51 providing a channel body for string select line transistors, and a portion which incorporates the reference conductor 52, such as the reference conductor 160 as shown in FIG. 1. Between the portion 51 and the portion of the vertical channel structure incorporating the reference conductor 52, a seam 53 is disposed within the vertical channel structure 15, between the even and odd word lines.

FIG. 3 illustrates string select lines 54 and 55. The string select lines 54 and 55 can include a more highly conductive film 56, 57 on the outside surfaces, such as a film of a metal silicide.

FIG. 3 also illustrates ground select lines 60 and 61. The ground select lines 60, 61 can include more highly conductive films 62, 63 on the outside surfaces, such as a film of metal silicide.

Likewise, conductive strips are disposed as even and odd word lines on opposing sides of the vertical channel structure 50. Thus, an even word line 58 is disposed opposite an odd word line 59 in the structure. Eight word line layers are illustrated in this example. Of course a larger number of word line layers, such as 16, 32, or more can be utilized.

As illustrated in FIG. 3, word lines may also include silicide films or other more highly conductive films (e.g. 62) on the outside surfaces.

In other embodiments, all or some of the string select lines, word lines and ground select lines are implemented using metal, or other conductive material, rather than polysilicon.

The structure illustrated in FIG. 3 provides independent charge storage sites 70, 71 on the even and odd sides of the vertical channel structure 50. Also, the structure supports operating first and second NAND strings on opposing sides of the vertical channel structure 50.

In the illustration of FIG. 3, the thickness in the vertical dimension of the word lines, the string select lines and the ground select lines determines the channel lengths of the string select transistor, the memory cells, and the ground select transistors.

The string select lines 54, 55 in the structure of FIG. 3 have substantially greater thickness than the word lines, such as more than four times the thickness. This greater channel length facilitates operating the string select transistor using a bias voltage on one side of the vertical channel structure which is sufficient to turn off the transistor, even when the bias voltage on the opposite side might otherwise be sufficient to turn it on. Using this structure, the decoding operation utilized to select individual vertical channel structures can take advantage of independent double gate operation.

The ground select lines 60, 61 in the structure illustrated in FIG. 3 also have substantially greater thickness than the word lines. Again, this facilitates the decoding operation. The ground select lines 60, 61 shown in FIG. 3 also extend over the reference conductor 52. As illustrated, the upper surface 66 of the reference conductor lies at a layer substantially above the lower surface 65 of the ground select line 61. This overlapping of the ground select line structure with a reference conductor can be utilized to improve the conductivity of the reference conductor for selected rows of vertical channel structures.

It can be seen therefore, that the reference conductor 52 is configured as a source line conductor structure beneath the plurality of active pillars. Though not seen in FIG. 3, the source line conductor is connected to one or more conductive pillars between conductive strips in the even and odd multilayer stacks, connected to the source line conductor structure. A reference line structure, such as a line in a patterned metal layer, can be arranged orthogonally over the even and odd stacks of conductive strips. The one or more conductive pillars is/are connected to the reference line structure. The conductive pillars can be provided by a subset of the active pillars in the block. However, the conductive pillars need not have the charge storage structures of the active pillars, and can have different dimensions. In some embodiments, the active pillars and the conductive pillars can be different materials.

Also, as shown in FIG. 3, the memory device is configured so that the odd memory cells on a given active pillar are configured as a first NAND string, and the even memory cells on said given active pillar are configured as a second NAND string. Thus, dual NAND strings are formed on a shared vertical channel structure.

In a dual NAND string configuration, the conductive strips in an upper level in the even and odd stacks are configured as string select lines for both the first and second NAND strings on a given active pillar. The conductive strips in intermediate levels in the even and odd stacks are configured as word lines for respective ones of the first and second NAND strings on a given active pillar. The conductive strips in a lower level in the even and odd stacks are configured as ground select lines for both the first and second NAND strings on a given active pillar. As illustrated in FIG. 3, the conductive strips are configured as ground select lines having a thickness such that they overlap with corresponding reference lines and with lower portions of the active pillars in the corresponding rows.

Also, the active pillars comprise a vertical channel structure including a seam at the intermediate levels, and no seam at the upper level where the string select transistors are disposed.

Figure 4:
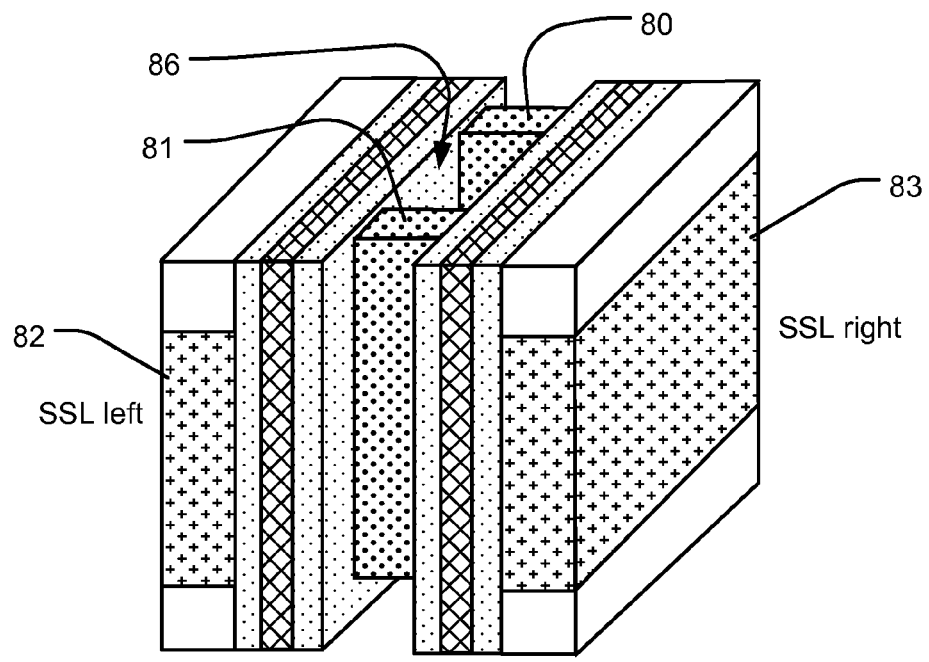
FIG. 4 is a perspective view of a string select transistor structure for an active pillar in a 3D memory device.

FIG. 4 illustrates a top section of an active pillar in the region of the string select lines 82, 83. In the illustration, active pillars 80 and 81, with dielectric charge storage structures 84 and 85 formed on opposing sides, extend between a left side string select line 82 and a right side string select line 83. In the frustum of each active pillar that is between the string select lines, a string select transistor is implemented.

In this illustration, an air gap 86 is implemented between the active pillars 80, 81. This can reduce capacitive coupling between the vertical channel structures.

Figure 5:
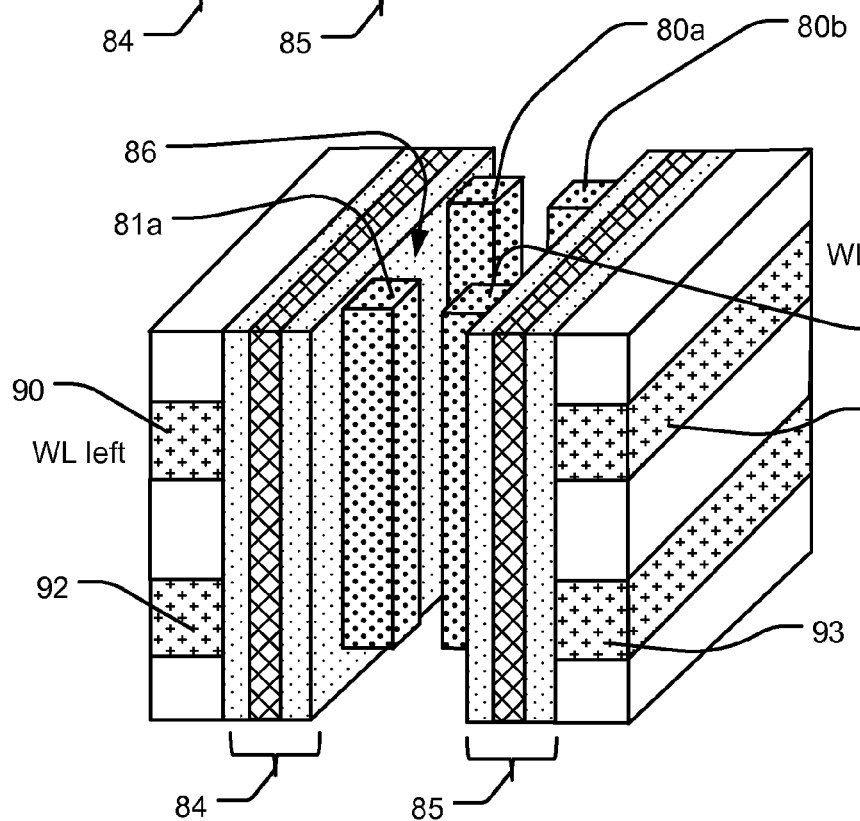
FIG. 5 is a perspective view of a two frustums of an active pillar with memory cells for an active pillar in a 3D memory device.

FIG. 5 illustrates an intermediate section of an active pillar in the region of the word lines. In the illustration, the active pillars are split by a seam as discussed above, resulting in a first active pillar portion 80a and a second active pillar portion 80b which merge into the active pillar 80 at the SSL region shown in FIG. 4. Also, the seam results in a first active pillar portion 81a and a second active pillar portion 81b which merge into the active pillar 81 in the SSL region shown in FIG. 4. The dielectric charge storage structures 84, 85 line sides of the word lines, including even word lines 90, 92 on the left and odd word lines 91, 93 on the right.

Although not illustrated in FIGS. 4 and 5, in the region of the ground select lines, the seam in the vertical channel structures can merge into a single body which can be part of the reference line as described above.

Figure 6:
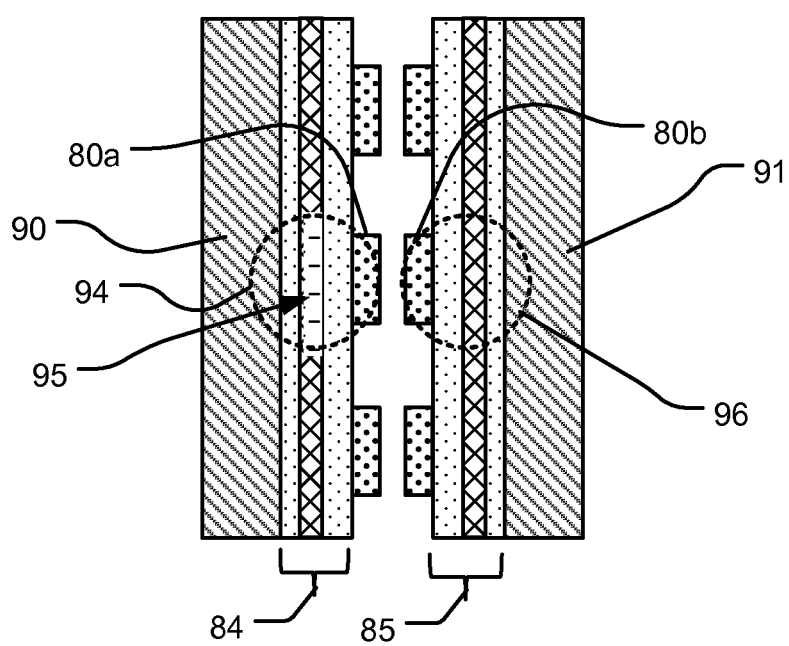
FIG. 6 is a top view of a frustum of an active pillar including memory cells on even and odd sides.

FIG. 6 is a top view taken at the level of word lines 90, 91 showing the memory cell structure at each frustum of the active pillars. In this example, the active pillar includes first portion 80a and second portion 80b, which are separated by a seam. The dielectric charge storage structures 84 and 85 separate the vertical channel structures in the active pillar from the word lines 90, 91. In order to independently program each side of the active pillar, programming bias voltages can be applied independently to word line 90 and word line 91. In order to program the cell 94 on the left side, gate program voltages are applied to the left word line 90, while inhibit voltages are applied to the right word line 91. The vertical channel structures in the active pillars are biased at a suitable level so that the difference between the gate program voltage and the voltage on the vertical channel is sufficient to induce charge trapping in the region 95 of the cell 94, while inhibiting transfer of charge out of the dielectric charge trapping structure in the adjacent cell 96.

Figure 7:
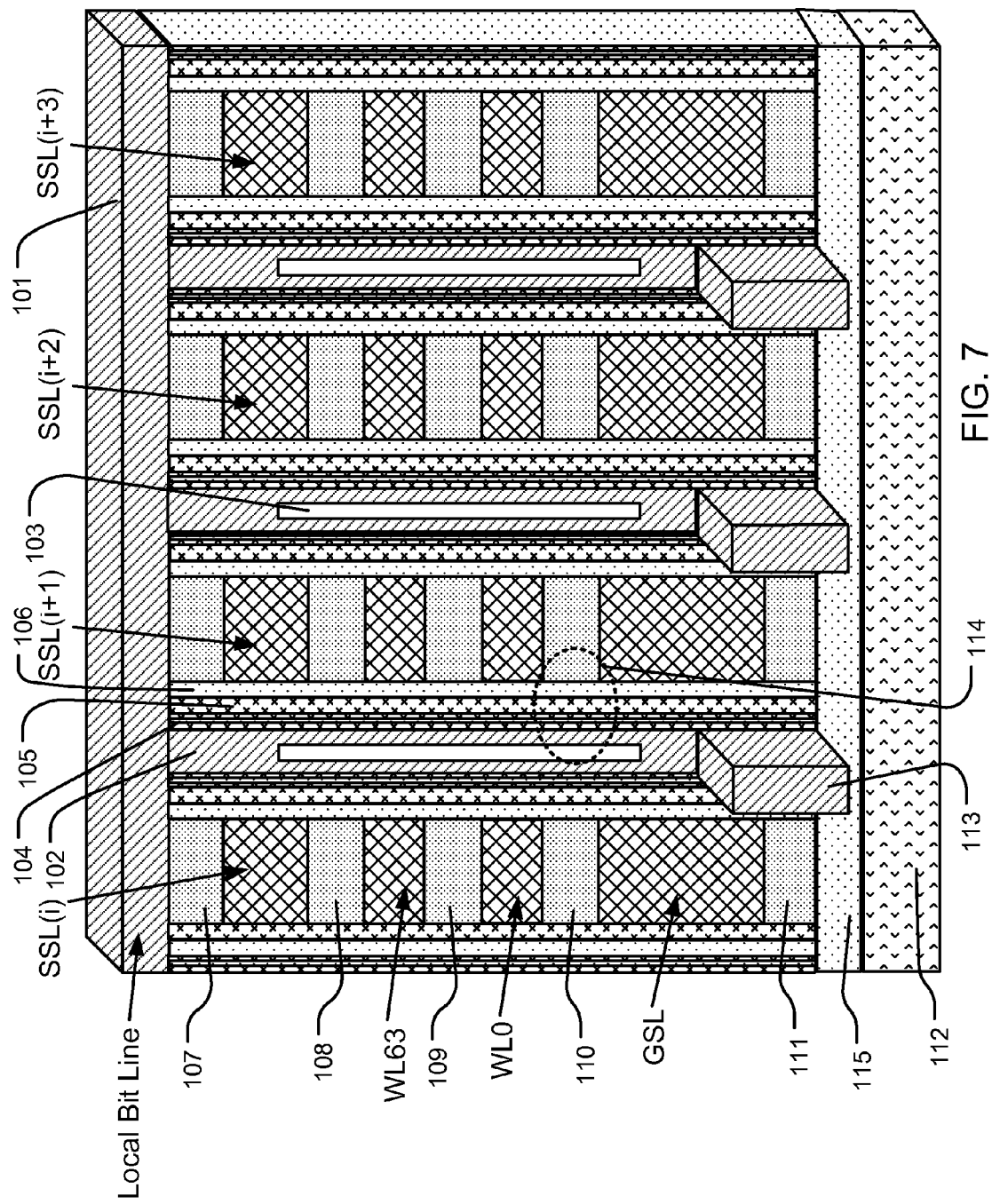
FIG. 7 is a 3D perspective diagram illustrating a row of active pillars including vertical channel structures as described herein.

FIG. 7 illustrates a slice of a 3D block configured for independent double gate, multiple-bit-per-cell operation, such that two NAND strings are disposed on each side of the active pillars as discussed above. The structure includes a local bit line overlying a column of active pillars, including vertical channel structure 102. Each of the active pillars includes a seam (e.g. seam 103). String select lines SSL(i) to SSL(i+3) are disposed in an upper layer of the stack on opposing sides of each active pillar. Independent word lines are also disposed on the opposing sides of the active pillars, in a plurality of layers. This illustration schematically represents 64 word line layers, by the labels WL0 to WL63. Ground select lines GSL are disposed in a lower layer of the active pillars. The string select lines, word lines and ground select lines are separated by insulating layers 107, 108, 109, 110, 111 in this illustration. Insulating layers 107-111 can comprise a selected interlayer dielectric, including silicon dioxide or other materials having higher or lower dielectric constants, or combinations of dielectrics.

Each of the active pillars terminates in a reference line 113. The structure overlies a dielectric layer 115, which in turn overlies the substrate 112. This region of the substrate 112 can be configured as a bottom gate structure, such as by implementing it as an isolated conductively doped well which can be biased as needed. The bottom gate structure can be used to improve the conductivity of the reference lines, if desired.

FIG. 7 illustrates a memory cell 114 in which the dielectric charge storage structure includes a multilayer tunneling structure 104, dielectric charge trapping layer 105 and a blocking layer 106. The structures can be formed on the sidewalls of a trench in the word line stack structure, starting with the blocking dielectric layer 106, and ending with the multilayer tunneling structure 104.

The multilayer tunneling structure 104 can be implemented using a bandgap engineered tunneling structure, which can include a silicon oxide layer less than 2 nm thick, adjacent the vertical channel structure 102, a silicon nitride layer less than 2 nm thick adjacent the silicon oxide layer, and the third layer comprising silicon oxide on the order of 3 nm or less thick.

The dielectric charge trapping layer 105 can comprise silicon nitride between 5 nm and 8 nm thick. The blocking layer 106 can comprise silicon oxide or other materials between 6 nm and 9 nm thick. In yet other embodiments, a dual trapping layer charge trapping structure can be implemented.

Figure 8:
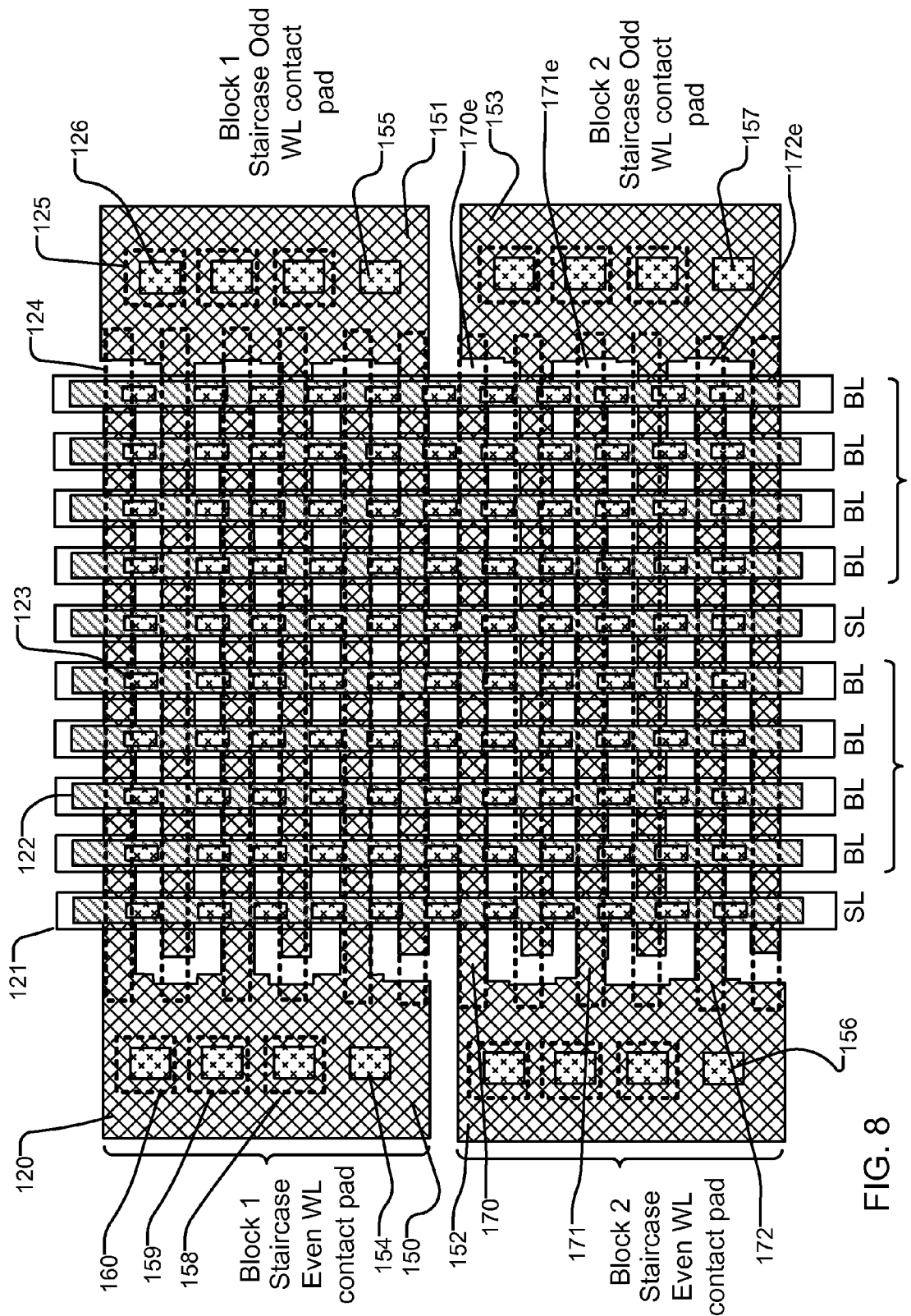
FIG. 8 is a partial layout view showing two blocks of a 3D memory device configured as described herein.

FIG. 8 is a layered layout view showing two blocks of independent double gate vertical channel structures. The layers illustrated include a layer 120 which shows the pattern of the word line structures. A layer 121 shows the pattern of overlying metal lines which are connected to the local bit lines or source lines in the structure. Layer 122 shows the pattern of the local bit lines and local source lines and the structure. The layer 123 illustrates interlayer contacts between the local bit lines and local source lines and the overlying metal lines. The layer 124 shows the layout of the string select lines which are adjacent the vertical channel structures in the active pillars. The layer 125 illustrates openings in the contact landing pads used in the formation of a stairstep contact structure. The layer 126 illustrates the interlayer contacts used in the stairstep structure.

As illustrated, there are two source lines SL in the pattern, and eight bit lines BL. It can be seen therefore that the layout pattern includes bit line structures utilized as source lines for connection to the underlying reference conductor as a source line (like the source line structure 150 of FIG. 1). The number of source lines used for connection to the underlying reference conductor can be set as suits a particular implementation. Between each of the source line structures, a set of bit lines is used for connection to actual memory cells (like the bit line structures 130 shown in FIG. 1).

The SSL lines are illustrated by the outlines in pattern 124. However, the material is removed from this illustration to improve the view of the layout of the word line structures. Therefore, the SSL lines, as can be seen from the outlines, are separate from one another, and overlie the word line structures. Contacts to the SSL lines can be made that are connected to an overlying patterned conductor layer for connection to SSL decoding logic.

Referring to the layer 120, the word line patterns for two blocks, Block 1 and Block 2, in the array structure are shown. Block 1 includes an even word line contact pad 150, and an odd word line contact pad 151. Likewise, Block 2 includes an even word line contact pad 152, and an odd word line contact pad 153. An interlayer connector 154 contacts the pad 150 in a landing area on the pad, and extends to an overlying patterned conductor, which is connected to word line decoding circuitry for the even word lines. Interlayer connector 155 contacts the odd word line pad 151 in a landing area on the pad, and also extends to an overlying patterned conductor which is connected to word line decoding circuitry for the odd word lines.

Referring to the even word line pad 150, openings 158, 159, 160 are formed to expose landing areas on the underlying layers of word lines, forming a stairstep contact structure. Also, interlayer conductors extend from the landing areas on the respective contact pads to the overlying decoding circuitry. Corresponding stairstep structures are formed on the other even and odd word line contact pads in the structure.

Referring to the even word line contact pad 152 in Block 2, the conductive strips 170, 171, 172 extend from the contact pad landing areas in a comb-like structure. The end 170e of the conductive strip 170 is separated from the odd word line contact pad 153 for the odd word lines in the block. Likewise, the end 171e of the conductive strip 171 is separated from the odd word line contact pad 153. Finally for this illustration, the 172e of the conductive strip 172 is separated from the odd word line contact pad 153. An interlayer connector 156 contacts the pad 152 in a landing area on the pad, and extends to an overlying patterned conductor, which is connected to word line decoding circuitry for the even word lines. Referring to the odd word line contact pad 153 in Block 2, a similar pattern is formed, and disposed in an interdigitated manner with the even word lines which extend from the pad 152. An interlayer connector 157 contacts the pad 153 in a landing area on the pad, and extends to an overlying patterned conductor, which is connected to word line decoding circuitry for the even word lines.

This enables the conductive strips acting as that even word lines on the left side to be biased independently of the conductive strips acting as odd word lines on the right side.

Figure 9:
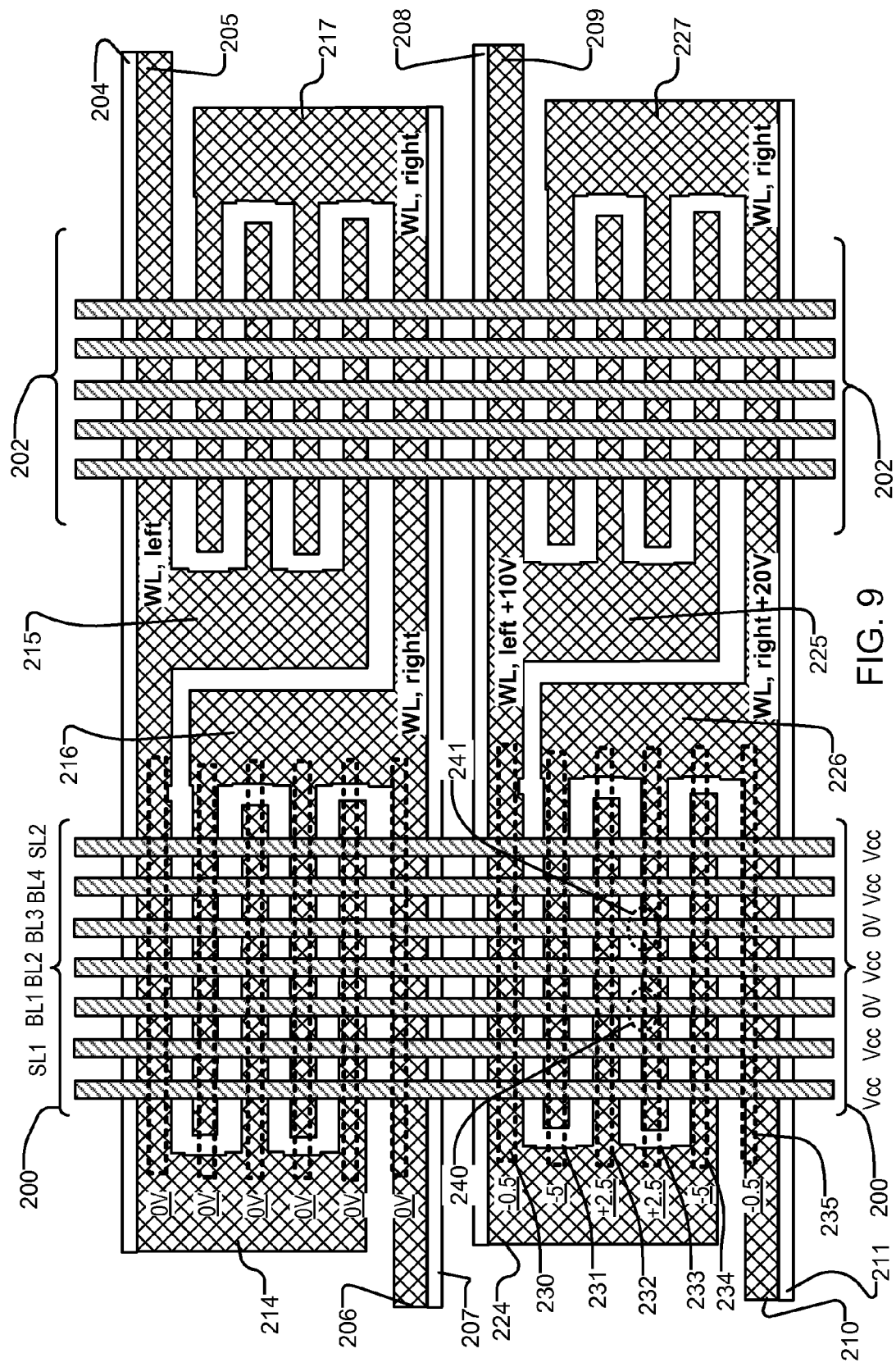
FIG. 9 is a partial layout view showing four blocks of a 3D memory device configured as described herein, and showing a program pulse bias arrangement.

FIG. 9 illustrates the layout the word line structures, bit line structures, and string select line structures of two columns and two rows of blocks in a 3D array. A first column of blocks 200 between brackets shares the source lines SL1-SL2 and the bit lines BL1-BL4. A second column of blocks 202 between brackets similarly share source lines and bit lines. The numbers of source lines and bit lines are relatively small to simplify the illustration. In some embodiments, there can be 16, 32, 64 or more bit lines interleaved with source lines for every four or eight bit lines, for example. Other configurations can be utilized.

One row of blocks is coupled in common to the horizontal conductor 205 (left word line structure) and the horizontal conductor 206 (right word line structure). Along the sidewalls of the conductors 205 and 206, silicide films 204, 207 or other conductive films can be applied.

The pads 214, 215 extend orthogonally from the conductor 205, and include conductive strips extending therefrom into the memory array structure for their corresponding blocks in comb-like structures as described above. The pads 216, 217 extend orthogonally from the conductor 206, and include conductive strips extending therefrom into the memory array structure for their corresponding blocks in comb-like structures that are interdigitated with the comb-like structures coupled to the conductor 205.

A second row of blocks is coupled in common to the horizontal conductor 209 (left word line structure) and the horizontal conductor 210 (right word line structure). Along sidewalls of the conductors 209, 210, silicide films 208, 211, or other conductive films, can be applied.

Pads 224, 225 extend orthogonally from the conductor 209, and include conductive strips extending therefrom into the memory array structure for their corresponding blocks in comb-like structures as described above. The pads 226, 227 extend orthogonally from the conductor 210, and include conductive strips extending therefrom into the memory array structure for their corresponding blocks in comb-like structures that are interdigitated with the comb-like structures coupled to the conductor 209.

String select lines overlie the conductive strips as discussed above, and are illustrated in outline for the first column of blocks 200. Thus, in the block coupled to the pads 224 in 226, string select lines 230-235 are disposed over corresponding word line structures.

In FIG. 9, bias voltages are illustrated for a programming operation, targeting charge storage sites 240, 241 on one side of an active pillar, which support two physical charge storage sites in each frustum. As can be seen, the charge storage sites 240, 241 are disposed on the side of the right word line structure which receives a high programming potential, while charge storage sites on opposing sides of the active pillar are not programmed because of the lower voltages applied to the left word lines.

Programming operations can be utilized to program two, or more, bits per charge storage site, using multiple-bit-per-cell programming techniques.

The illustrated bias for a program pulse utilized in such a program technique includes a neutral or zero voltage on the string select lines of the upper, unselected block in the first column of blocks 200, which disconnects the memory cells in the upper block from the overlying bit lines. In the selected block, the two string select lines on opposing sides of a selected active pillar are biased at about +2.5 volts, connecting the active pillar to the overlying bit line. The adjacent string select lines are biased at an inhibit voltage of about −5 V for example, which is sufficient to turn off the string select transistor in adjacent active pillars even in the presence of the 2.5 V on the opposing side. More distant string select lines can be biased at a lesser inhibit voltage, such as about −0.5 V decoupling them from their corresponding bit lines. The selected word line, in this example the right word line 210 can be biased at a high program pulse, such as about +20 V or other level as suitable for the particular stage of the programming operation. The unselected word line in the same block, word line 209 in this example, can be biased at a lower voltage insufficient to cause programming, such as about +10 V. This voltage can match the pass voltage applied to unselected layers in this block, and can enable channel boosting to prevent program disturb.

Bit lines coupled to the selected charge storage sites 240, 241, can be biased at a low voltage, such as about 0 V to support a programming field in combination with the high voltage applied to the word lines. The source lines SL1 and SL2 can be coupled to the supply potential, to apply VCC to the source end of the NAND strings being accessed.

Bit lines coupled to unselected charge storage sites can be coupled to the supply potential about VCC to inhibit current flow in the unselected active pillars, allowing boosting of unselected active pillars to inhibit program disturb.

The word lines for unselected blocks in the first row coupled to the conductors 206, and 205 can be left floating.

The block in the second row coupled to the conductors 209 and 210, and in the second column of blocks 202 can be biased for programming as well.

Table 1 illustrates a representative program bias arrangement. The array with this architecture can be biased to program only one side of each active pillar at a time. This enables the use of both sides of each active pillar at each layer to store data, with multiple bits per side.

TABLE 1

| PROGRAM BIAS | |
| --- | --- |
| SELECTED WL(N)_even: | Vprog (ISPP, e.g. 18 to 22 V) |
| OPPOSITE SIDE WL(N)_odd | Vpass, pgm (e.g. +10 V) |
| OTHER WLs: (other layers, even and odd) | Vpass, pgm (e.g. +10 V) |
| GSL: | Vpass, pgm (e.g. +10 V) |
| SELECTED BLs: | Vsense (e.g. 0 V) |
| UNSELECTED BLs: | Vref (e.g. 3.3 V) |
| Local SLs: | Vref (e.g. 3.3 V) |
| SELECTED SSL(i): | Von (e.g. +2.5 V) |
| SELECTED SSL(i + 1): | Von (e.g. +2.5 V) |
| ADJACENT SSL(i − 1): | Vsuppress (e.g. −5 to −8 V) |
| ADJACENT SSL(i + 2): | Vsuppress (e.g. −5 to −8 V) |
| FAR SSLs: | Voff (e.g. −0.5 V) |

In one example, the programming algorithm can be an incremental stepped pulse programming sequence ISPP, with increasing pulse height and program verify steps being executed until desired threshold levels are satisfied. In other systems, a single pass, multilevel program operation can be applied, such as described in co-pending and commonly owned U.S. patent application Ser. No. 14/153,934, entitled PROGRAMMING MULTIBIT MEMORY CELLS; by Hsieh et al., filed on 13 Jan. 2014 (P1020033US) (now US Pat. Pub. No. 2014/0198570); which application is incorporated by reference as if fully set forth herein. One example process executed by the controller to operate a multiple-bit-per-cell memory, comprises storing a data set for programming a plurality of multi-level memory cells in a page buffer, the data set indicating one of a plurality of program states or an inhibit state for each memory cell in the plurality, where the plurality of program states correspond to a corresponding plurality of target program levels for the multi-level memory cells. For the data set, the method includes executing a plurality of program cycles for the plurality of multi-level memory cells, wherein a program cycle in the plurality of program cycles includes applying a program bias to multi-level memory cells in the plurality of program states, and after applying the program bias applying program verify steps for more than one of the plurality of program levels to change the data set program states to the inhibit state for the multi-level memory cells in the plurality which pass verify at the indicated target program level. The data set can be applied in each cycle in the one-pass, multiple-level operation to determine inhibit and program states for the selected cells.

Table 2 illustrates a representative erase bias arrangement. A block erase bias can be applied in a periodic array that includes a plurality of cell blocks such as that illustrated in FIG. 9.

TABLE 2

ERASE BIAS

| | |
|---|---|
| ALL WLs selected block: | Vref (e.g. 0 V) |
| ALL WLs unselected blocks: | Floating |
| ALL BLs: | Verase(e.g. +20 V) |
| ALL Local SLs: | Verase (e.g. +20 V) |
| ALL SSLs: | Vgidl (e.g. +6 V) |

Figure 10:
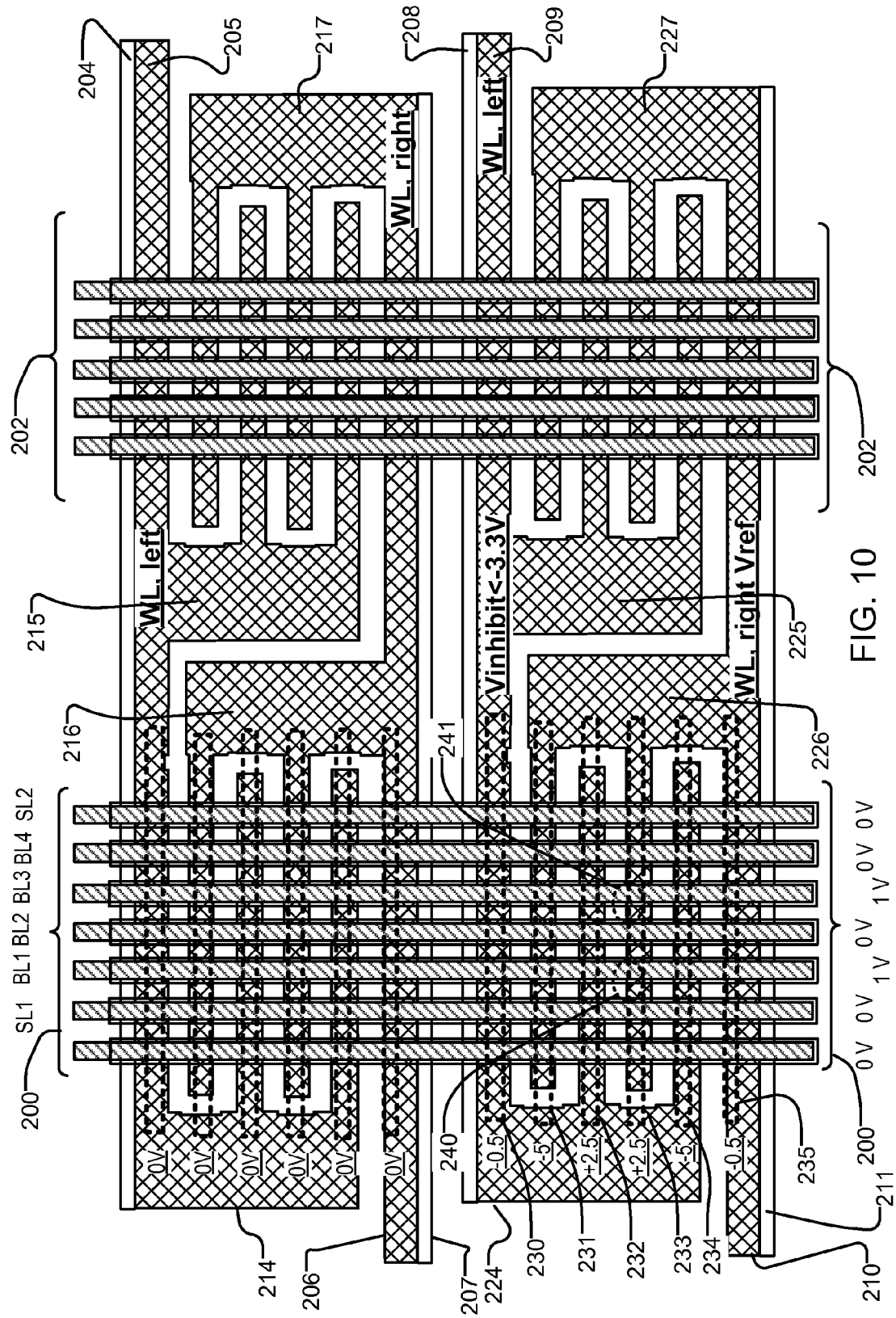
FIG. 10 is a partial layout view showing four blocks of a 3D memory device, as in FIG. 9, and showing a read pulse bias arrangement.

FIG. 10 illustrates the layout also shown in FIG. 9, with the same reference numerals. In FIG. 10, however, the bias voltages are illustrated for a read operation for the cells 240, 241 in a multiple-bit-per-cell, independent double gate structure.

The bias voltages for the string select lines are the same as used for programming. The bias voltages for unselected bit lines BL2 and BL4 and for the source lines SL1 and SL2 are about 0 V. The bias voltage for selected bit lines BL1 and BL3 is about one volt.

The bias voltage applied to the right side word line structure is the read voltage Vref. In unselected layers of the structure, the right side word line voltage will be a pass voltage. The bias voltage applied to the left side word line structure is an inhibit voltage of about −3.3 V for example.

In the deselected blocks, the word lines are left floating and the string select lines and ground select lines are turned off.

Table 3 illustrates a representative read bias arrangement.

TABLE 3

READ BIAS

| | |
|---|---|
| SELECTED WL(N)_even: | Vread (set for threshold states) |
| OPPOSITE SIDE WL(N)_odd | Vinhibit (e.g. −3.3 V) |
| OTHER WLs: (other layers, even and odd) | Vpass, read (e.g. +6 to +7 V) |
| GSL: | Vpass, read (e.g. +6 to +7 V) |
| SELECTED BLs: (e.g. 325, 327, 329) | Vsense (e.g. +1 V) |
| UNSELECTED BLs: (e.g. 326, 328) | Vref (e.g. 0 V) |
| Local SLs: (e.g. 330, 331) | Vref (e.g. 0 V) |
| SELECTED SSL(i): (e.g. 313) | Von (e.g. +2.5 V) |
| SELECTED SSL(i + 1): (e.g. 319) | Von (e.g. +2.5 V) |
| ADJACENT SSL(i − 1): | Vdeplete (e.g. −5 to −8 V) |
| ADJACENT SSL(i + 2): | Vdeplete (e.g. −5 to −8 V) |
| FAR SSLs: | Voff (e.g. −0.5 V) |

Note that for each page, only half of the global bit lines are utilized. To sense the data in the other half of the global bit lines, the two adjacent pages on the same word line must be accessed sequentially using this bias arrangement. Since the even/odd word lines each contact one side of two of the active pillars, the read method illustrated reads only the stored charge on one side of the selected word lines. In this way, each side of the cell in a selected active column can be accessed separately, establishing two charge storage sites per cell at each frustum of each pillar. Each of the two charge storage sites can store more than one bit, such as two bits per side. In this manner, the cells at each frustum of each pillar store four or more bits of data. This can result in a very high density memory array.

Figure 11:
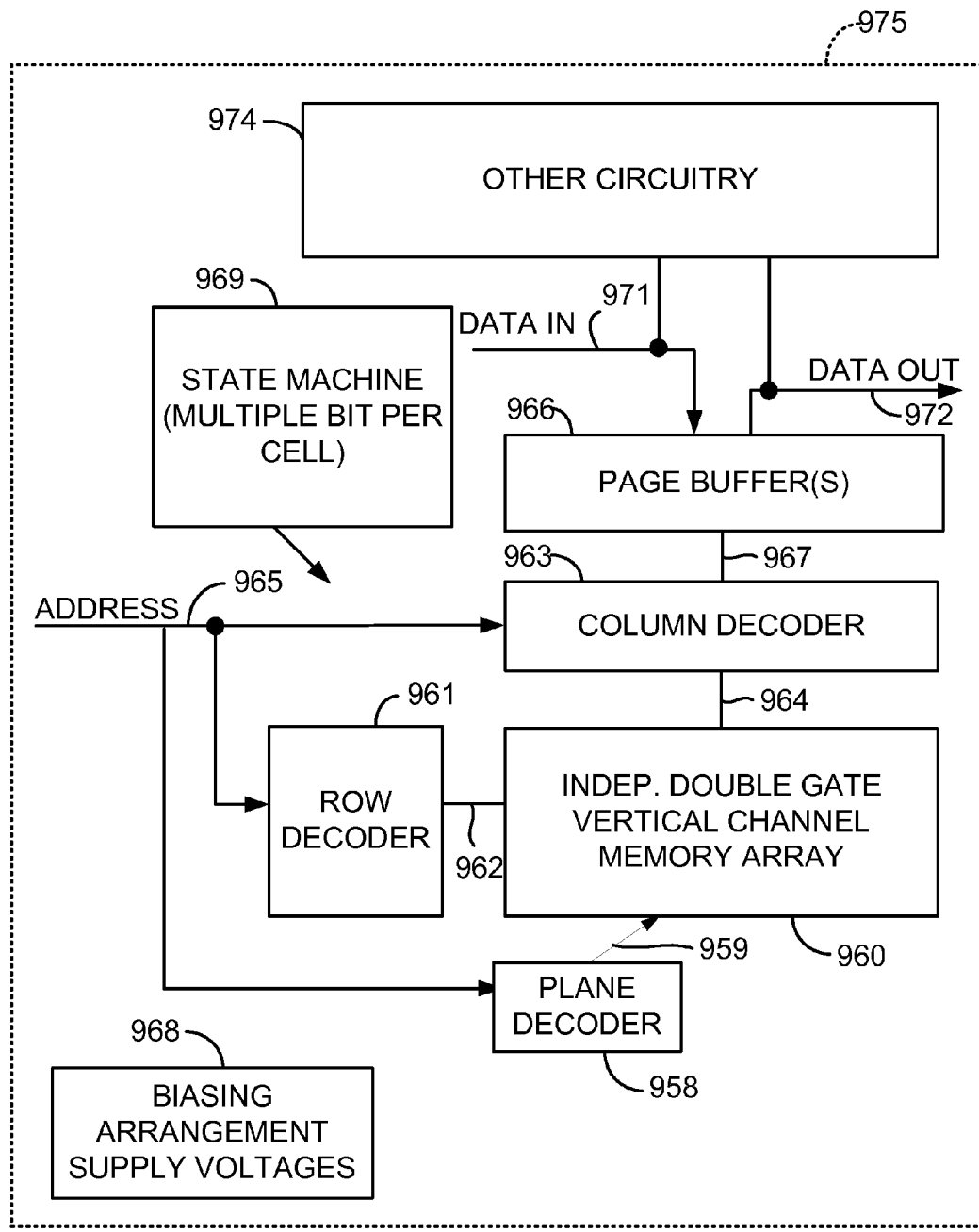
FIG. 11 is a block diagram of an integrated circuit memory including a 3D independent double gate memory array configured for multiple-bit-per-cell operation.

FIG. 11 is a simplified block diagram of an integrated circuit according to an embodiment of the present invention. In the example shown in FIG. 10, the integrated circuit 975 includes an independent double gate, multiple-bit-per-cell, vertical channel memory array 960 (IDGVC) on an integrated circuit substrate. A row decoder 961 is coupled to a plurality of word lines 962, and arranged along rows in the memory array 960. A column decoder 963 is coupled to a plurality of bit lines 964 (or SSL lines as described above) arranged along columns in the memory array 960 for reading and programming data from the memory cells in the memory array 960. A plane decoder 958 is coupled to a plurality of planes in the memory array 960 on lines 959 (or bit lines as described above). Addresses are supplied on bus 965 to column decoder 963, row decoder 961 and plane decoder 958. Page buffers in Block 966 are coupled to the array 960 in this example via data bus 967. Data is supplied via the data-in line 971 from input/output ports on the integrated circuit 975 or from other data sources internal or external to the integrated circuit 975, to the page buffers 966. In the illustrated embodiment, other circuitry 974 is included on the integrated circuit, such as a general purpose processor or special purpose application circuitry, or a combination of modules providing system-on-a-chip functionality supported by the programmable resistance cell array. Data is supplied via the data-out line 972 from the page buffers 966 to input/output ports on the integrated circuit 975, or to other data destinations internal or external to the integrated circuit 975.

A controller 969, implemented in this example using a bias arrangement state machine, controls the application of bias arrangement supply voltage generated or provided through the voltage supply or supplies in Block 968, such as read and program voltages. The controller can be implemented using special-purpose logic circuitry as known in the art. In alternative embodiments, the controller comprises a general purpose processor, which can be implemented on the same integrated circuit, which executes a computer program to control the operations of the device. In yet other embodiments, a combination of special-purpose logic circuitry and a general purpose processor can be utilized for implementation of the controller.

In the example shown in FIG. 11, controller 969 comprises a state machine and other logic circuits. The controller implements operations, using a bias arrangement state machine, which supply voltages generated or provided through the voltage supply or supplies in Block 968, such as read, erase, verify and program bias voltages. The controller 969 is coupled to the page buffers 966 and the memory array 960. The controller 969 includes logic to control multiple-level program operations. In embodiments supporting the independent double gate vertical NAND structures described herein, the logic is configured to perform the method of:

selecting a layer of memory cells in the array, such as using a word line layer decoder;

selecting a side of the vertical channel structures in the selected layer such as by selecting an even or odd word line structure;

selecting vertical channel structures in a selected row in the array such as by using SSL switches on the rows of vertical channel structures; and storing multiple levels of charge to establish multiple bits per cell in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

The controller implements a program operation configured to store multiple levels of charge to represent more than one bit of data in the charge trapping sites in the selected layer on the selected side of the active pillars. In this manner, so that a selected frustum of an active pillar in the array includes two charge storage sites, each of which stores more than one bit, including more than one bit on each side of the pillar.

The memory array 960 can comprise charge trapping memory cells configured to store multiple bits per cell, by the establishment of multiple program levels that correspond to amounts of charge stored, which in turn establish memory cell threshold voltages $V_T$.

The controller can include logic to apply a multi-level programming operation to selected cells, including for example a process of storing multibit data in the page buffer, and programming selected cells using a verify threshold determined by the multibit data, and applied in an incremental stepped pulse programming cycle associated with each possible programming level.

Figure 12:
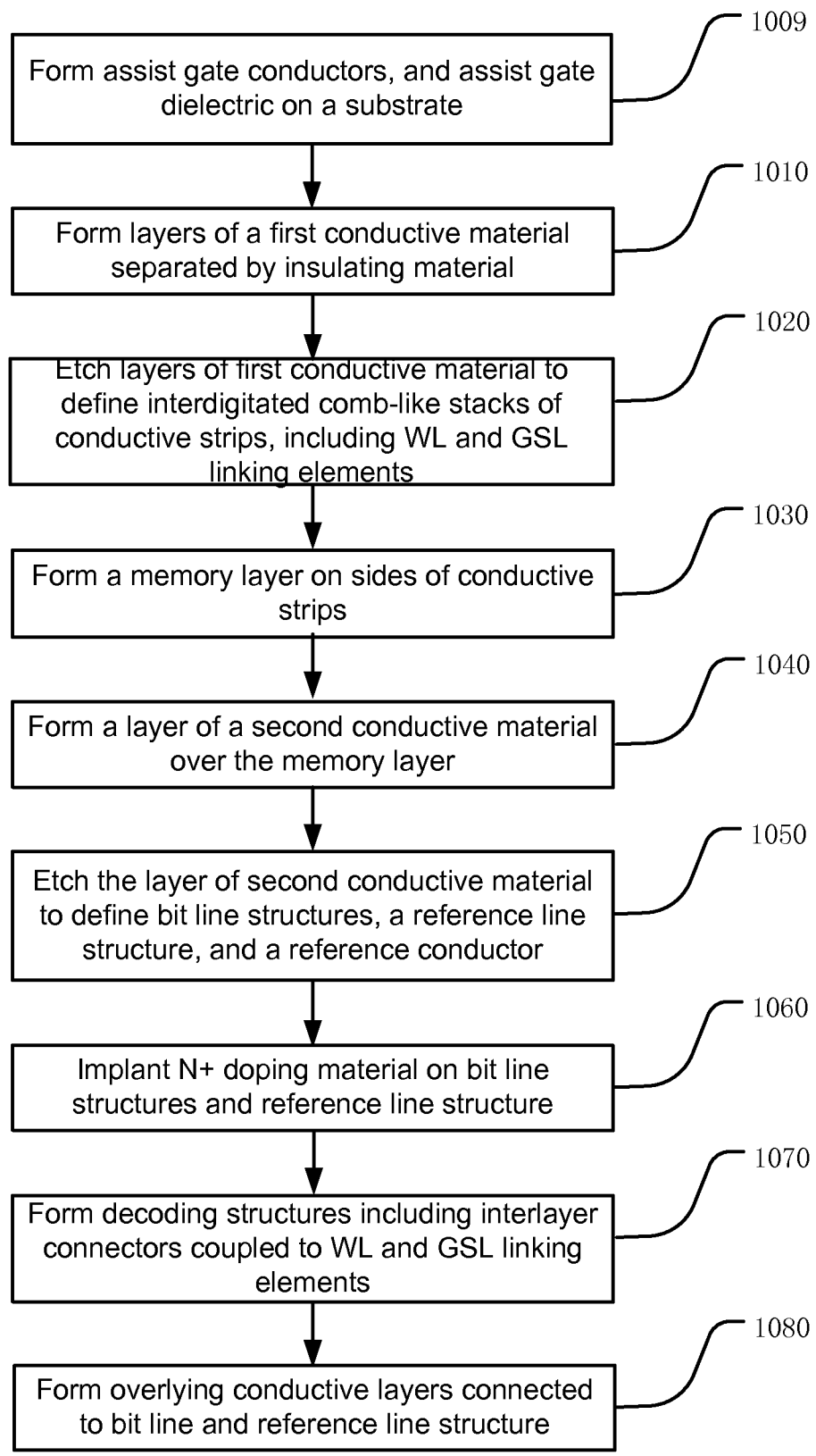
FIG. 12 is a flow chart illustrating a method for manufacturing a double gate vertical channel structure.

FIG. 12 is a flow chart illustrating a method for manufacturing a memory device. The method includes identifying areas on a substrate for formation of 3D memory blocks having a structure like that of FIG. 1. For each area, the method includes forming assist gate conductors by implanting assist gate wells in the substrate, or by patterning conductive material on the substrate. Over the assist gate conductors (e.g., 101 in FIG. 1), a layer of assist gate dielectric, such as silicon dioxide, is formed (Block 1009). Over the insulating layer, the process includes forming a plurality of layers of a first conductive material separated by insulating material (Block 1010), and etching the plurality of layers to define a plurality of stacks of conductive strips (Block 1020). The stacks include at least a bottom plane (GSL) of conductive strips, a plurality of intermediate planes (WLs) of conductive strips, and a top plane of conductive strips (SSLs).

The method includes forming a memory layer on side surfaces of conductive strips in the plurality of stacks (Block 1030). The memory layer contacts side surfaces of the plurality of conductive strips.

The method includes forming a layer of a second conductive material over and having a surface conformal with the memory layer on the plurality of stacks (Block 1040).

The method includes etching the layer of second conductive material to define a plurality of bit line structures (Block 1050) arranged orthogonally over, and having surfaces conformal with, the plurality of stacks. The bit line structures include inter-stack semiconductor body elements between the stacks and linking elements over the stacks connecting the inter-stack semiconductor body elements.

The step of etching the layer of second conductive material (Block 1050) is also used in this example, to define at least one reference line structure Block arranged orthogonally over the plurality of stacks. The reference line structure includes inter-stack vertical conductive elements between the stacks in electrical communication with the layer of common source conductor material. Also, the reference line structure can include linking elements over the stacks connecting the inter-stack vertical conductive elements. The step of etching the layer of second conductive material stops at a level above the layer of assist gate dielectric such that portions of the layer of second conductive material below the level remain to form a reference conductor (e.g. 160 in FIG. 1). The reference conductor is connected to the reference line structure and the bit line structures to allow electrical communication from the reference line structure to the bit line structures.

As a result of forming the bit line structures, memory cells are formed at each frustum of the pillars in interface regions at cross-points on opposing side surfaces of the conductive strips in the plurality of intermediate planes (WLs) in the stacks and the inter-stack semiconductor body elements of the plurality of bit line structures. Also, string select switches are disposed at interface regions with the top plane of conductive strips (SSLs), and reference select switches are disposed at interface regions with the bottom plane (GSL) of conductive strips. The memory layer can comprise dielectric layers that can act as the gate dielectric layers for the string select switches and reference select switches.

In one embodiment, the method can include implanting N+ doping material, with a first energy level, on the linking elements in the plurality of bit line structures, the reference conductor, and the linking elements in the at least one reference line structure (Block 1060). The method can further include implanting N+ doping material, with a second energy level, on the inter-stack vertical conductive elements of the at least one reference line structure (Block 1060), wherein the second energy level is higher than the first energy level.

The inter-stack vertical conductive elements in the at least one reference line structure can have a larger cross-sectional area than the inter-stack semiconductor body elements in the bit line structures, as illustrated in FIG. 2.

In one embodiment, the step of etching the plurality of layers to define a plurality of stacks of conductive strips (Block 1020) in the method can include forming linking elements connecting sets of word lines in the intermediate planes (WL) as part of a decoding structure. The method further includes forming openings in the linking elements, and forming interlayer connectors coupled to landing areas in the linking elements as another part of the decoding structure, where the interlayer connectors coupled to landing areas in lower intermediate planes extend through the openings in the linking elements (Block 1070).

The step of etching the plurality of layers to define a plurality of stacks of conductive strips (Block 1020) in the method can further include forming linking elements connecting sets of ground selection lines in the bottom plane. The method further includes forming interlayer connectors coupled to landing areas in the linking elements in the bottom plane, where the interlayer connectors extend through the openings in the linking elements in the intermediate planes (WLs) (Block 1070).

In one embodiment, a group of bit lines in the bit line structures and at least a source line in the at least one reference line structure are arranged orthogonally over a first set of word lines in the intermediate planes (WL), and a second adjacent set of word lines in the intermediate planes (WL), and the interlayer connectors for the first set are arranged on a side of the group parallel to the bit lines in the group, and the interlayer connectors for the second set are arranged on the same side of the group.

In an alternative embodiment, a group of bit lines in the bit line structures and at least a source line in the at least one reference line structure are arranged orthogonally over a first set of word lines in the intermediate planes (WL), and a second adjacent set of word lines in the intermediate planes (WL), and the interlayer connectors for the first set are arranged on a side of the group parallel to the bit lines in the group, and the interlayer connectors for the second set are arranged on an opposing side of the group.

In one embodiment, the method can include forming blocks that include linking elements connecting sets of word lines in the intermediate planes (WLs), and interlayer connectors coupled to landing areas in the linking elements, where ends of the word lines in adjacent blocks are connected via the linking elements, and the linking elements include openings through which interlayer connectors coupled to landing areas in lower intermediate planes extend. The method can further include forming sidewall silicide formations on at least one side of adjacent blocks parallel to word lines in the adjacent blocks.

In an alternative embodiment, the method can include forming pairs of adjacent stacks in the plurality of stacks of conductive strips, wherein charge storage structures are disposed in interface regions at cross-points between side surfaces of a first side of word lines in the intermediate planes (WLs) and the inter-stack semiconductor body elements in the plurality of bit line structures. The method can further include forming sidewall silicide formations on side surfaces of a second side of the word lines opposite the first side in the intermediate planes (WLs) of conductive strips in the pairs of adjacent stacks.

The method can further include forming a first overlying conductive layer connected to the plurality of bit line structures, including a plurality of global bit lines coupled to sensing circuits, and forming a second overlying conductive layer connected to the at least one reference line structure, coupled to a reference voltage source (Block 1080).

Figure 13:
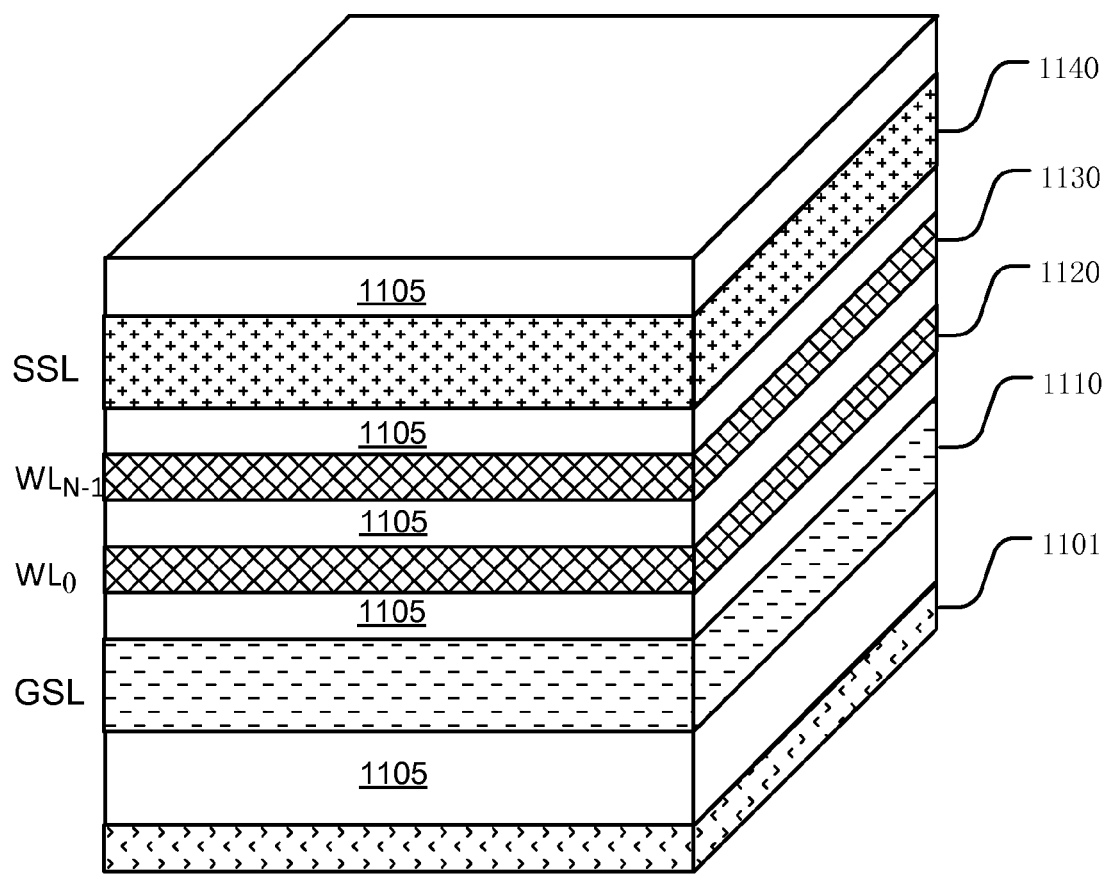
FIGS. 13 through 20 illustrate an example process flow for a double gate vertical channel structure.

FIGS. 13 through 20 illustrate an example process flow for a double gate vertical channel structure. FIG. 13 illustrates a stage of the process flow after forming an assist gate conductor 1101, and a plurality of layers of a first conductive material, such as layers 1110, 1120, 1130 and 1140, separated by layers of insulating material 1105, on an integrated circuit substrate (not shown).

Figure 14:
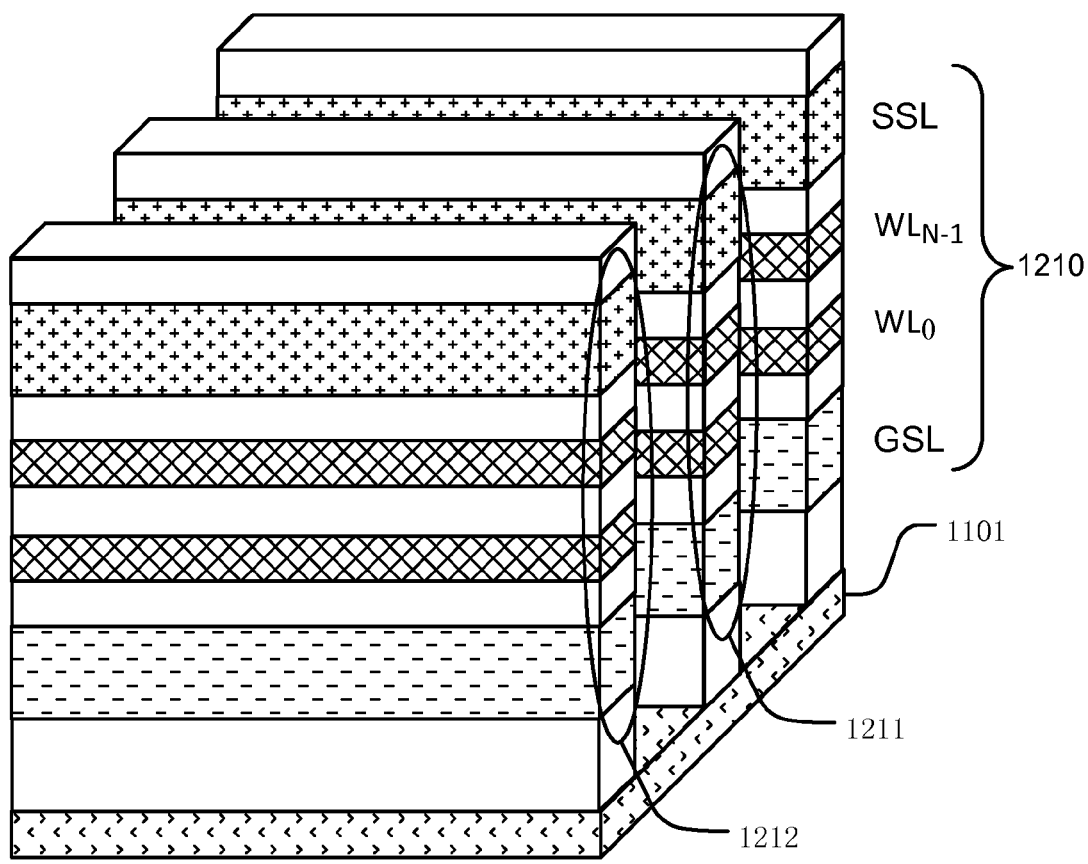

FIG. 14 illustrates a stage of the process flow after etching the plurality of layers, and stopping at the assist gate conductor 1101, to define a plurality of stacks of conductive strips, including stacks 1210, 1211 and 1212. The stacks 1210, 1211 and 1212 include at least a bottom plane (GSL) of conductive strips, a plurality of intermediate planes (WLs) of conductive strips, and a top plane of conductive strips (SSLs). The plurality of intermediate planes can include N planes, ranging from 0 to N−1, as illustrated in FIG. 13, for the stack 1210. Although not shown, the conductive strips are linked by pads defined in the pattern used for etching the stacks. The pads can be used to form linking elements, like those of FIGS. 8-10 above, in subsequent steps.

Figure 15:
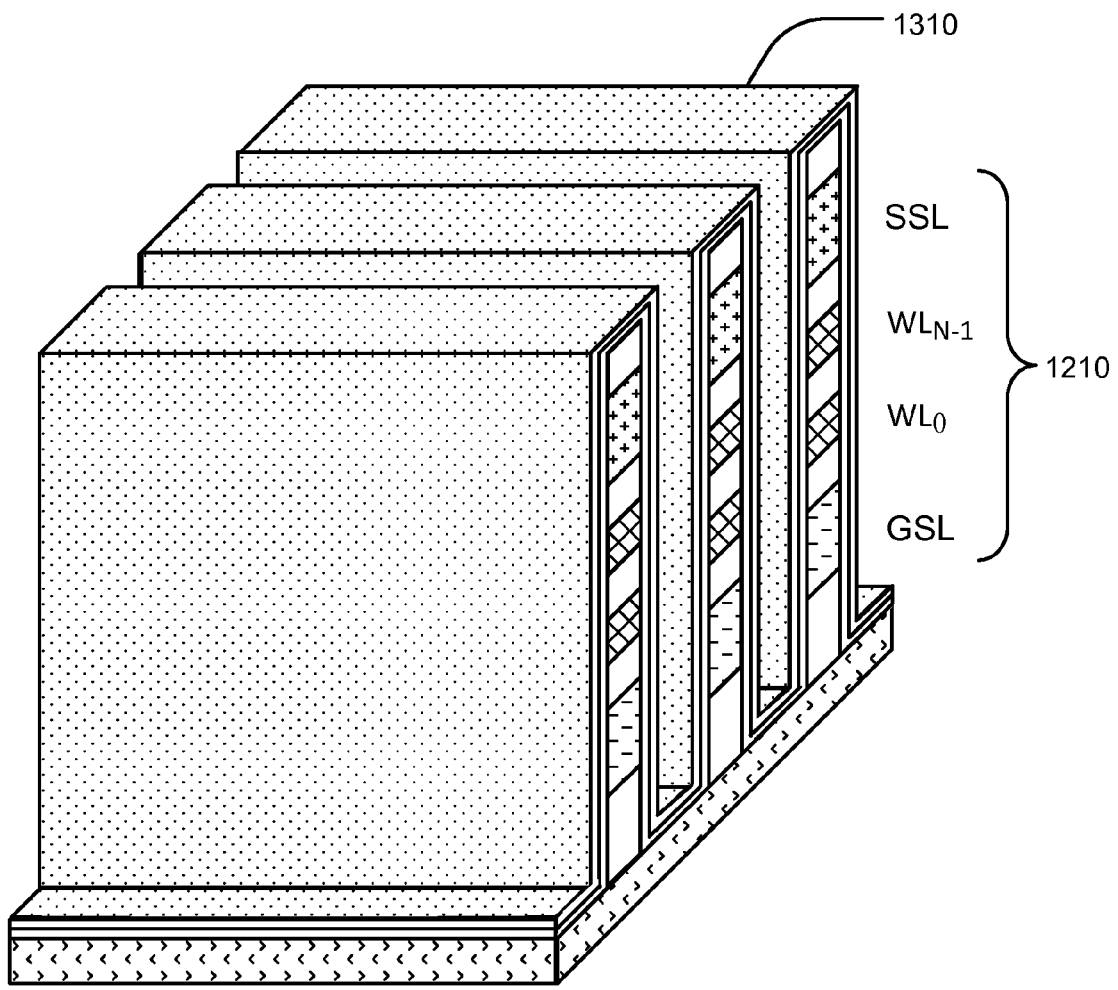

FIG. 15 illustrates a stage of the process flow after forming a memory layer 1310 over and on sides of conductive strips in the plurality of stacks, including the stack 1210. The memory layer 1310 contacts side surfaces of the plurality of conductive strips. The memory layer 1310 can comprise a multilayer, dielectric charge storage structure as discussed above.

Figure 16:
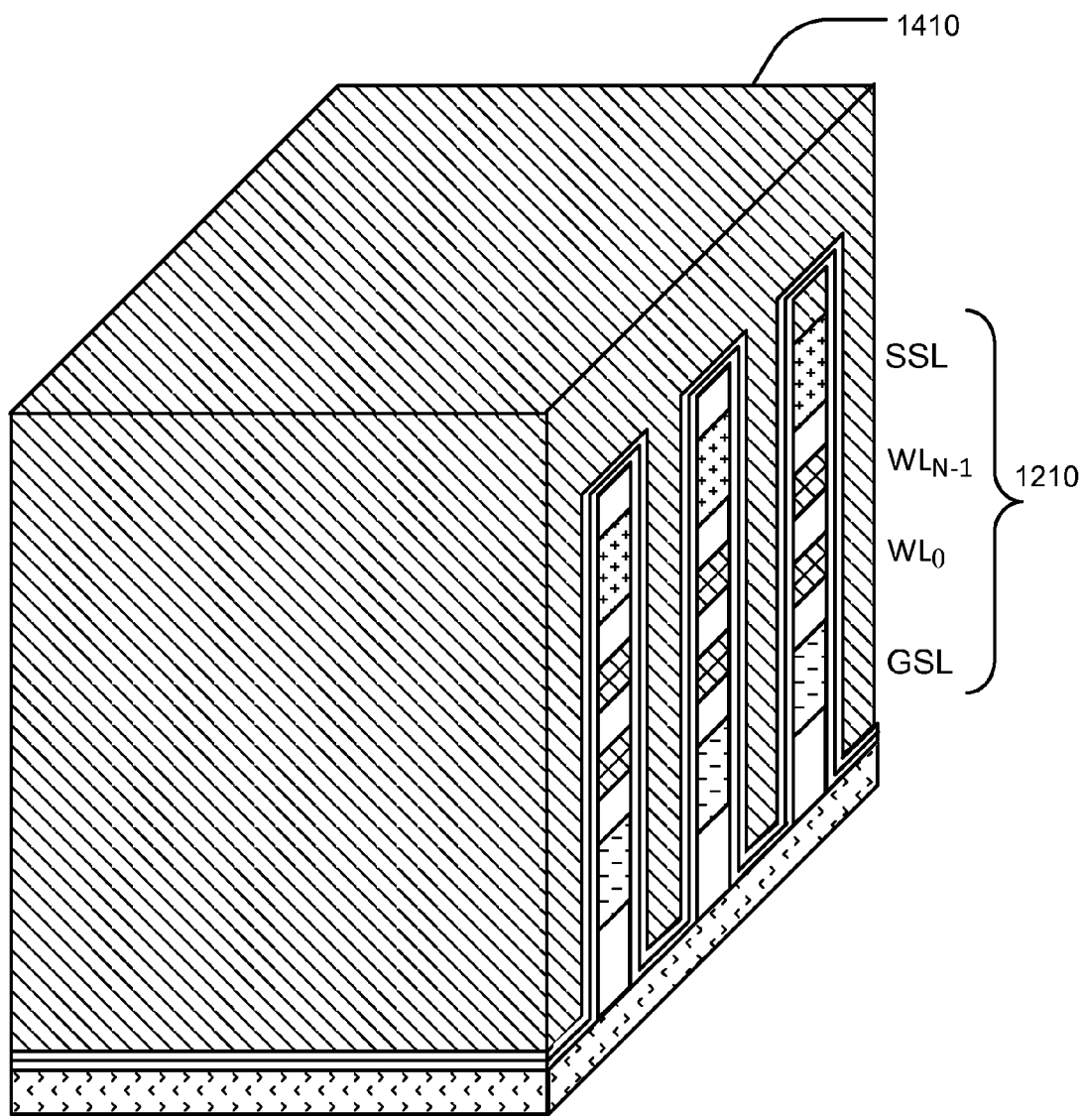

FIG. 16 illustrates a stage of the process flow after forming a layer of a second conductive material 1410 over, and having a surface conformal with, the memory layer 1310 on the plurality of stacks, including the stack 1210. The second conductive material comprises a semiconductor adapted at least in the regions between the stacks, to act as channel regions for vertical strings of memory cells.

Figure 17:
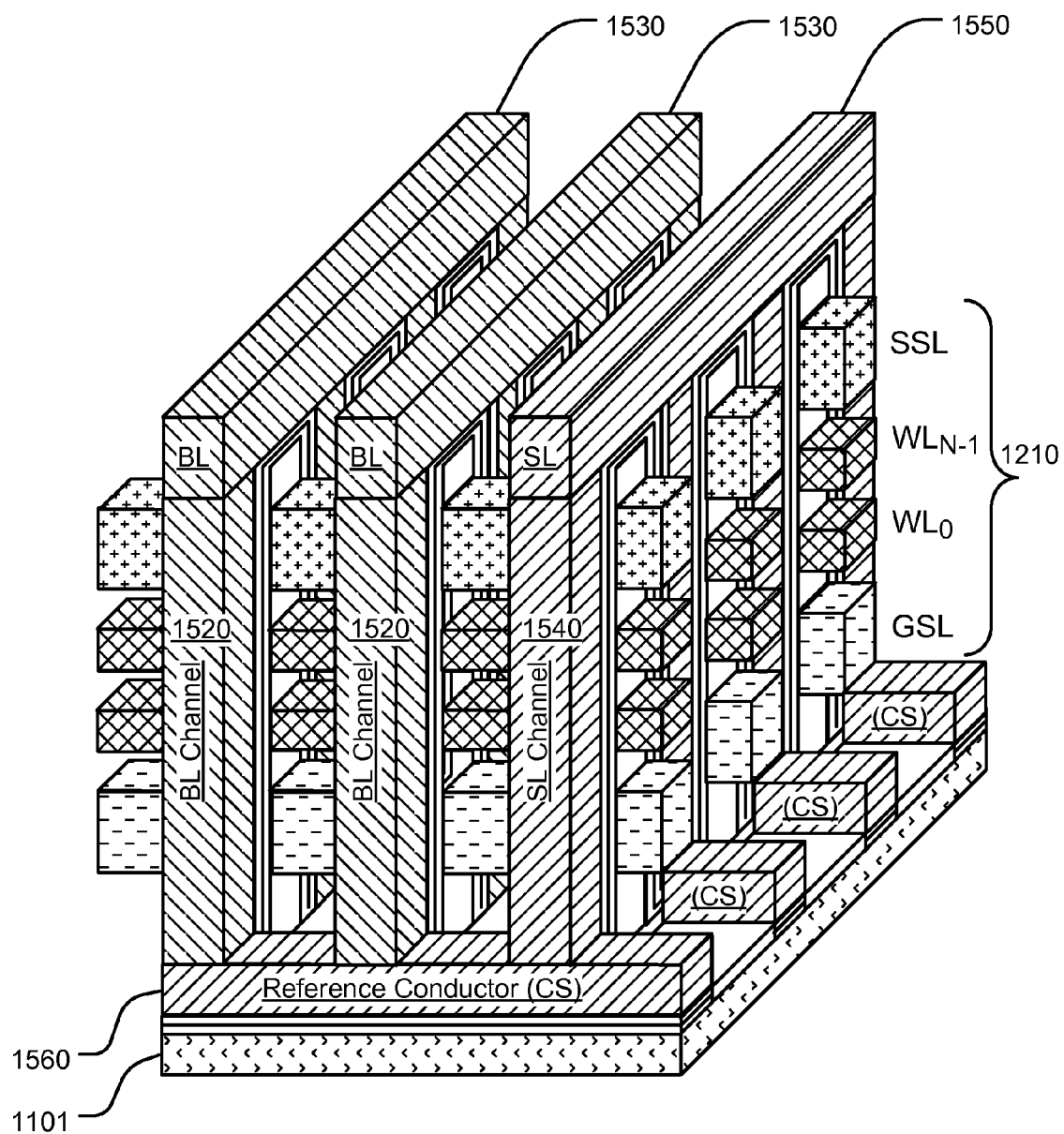

FIG. 17 illustrates a stage of the process flow after a patterned and timed etch of the layer of second conductive material 1410, which is timed to stop before reaching the memory layer 1310 between the stacks, so that a reference conductor (e.g. 1560) is formed between each stack. Other processes to stop the etching in order to form the reference conductor can be used as well, including the use of an etch stop layer, disposed in the second conductor material in the trenches at the desired depth. The pattern of the etch defines a plurality of bit line structures 1520/1530 arranged orthogonally over, and having surfaces conformal with, the plurality of stacks, including the stack 1210. The bit line structures 1520/1530 include inter-stack semiconductor body elements 1520 between the stacks extending to the reference conductors (e.g. 1560), and linking elements 1530 over the stacks connecting the semiconductor body elements 1520. To reveal underlying structure, the illustration shows openings between the conductive strips in the stacks, in the regions between the bit line structures. However, these openings will be filled with an insulating material between the strips in the stacks.

The step of etching the layer of second conductive material also defines at least one reference line structure 1540/1550, arranged orthogonally over the plurality of stacks. The reference line structure includes inter-stack vertical conductive elements 1540 extending to the reference conductor (e.g., 1560) between the stacks and linking elements 1550 over the stacks connecting the inter-stack vertical conductive elements 1540.

FIG. 17 illustrates that the reference conductor 1560 left as a result of the patterned, timed etch is disposed between the bottom plane (GSL) of conductive strips and the assist gate structure 1101 on the substrate.

The memory layer 1310 can act as an assist gate dielectric between the reference conductor 1560 and the assist gate conductor 1101.

Figure 18:
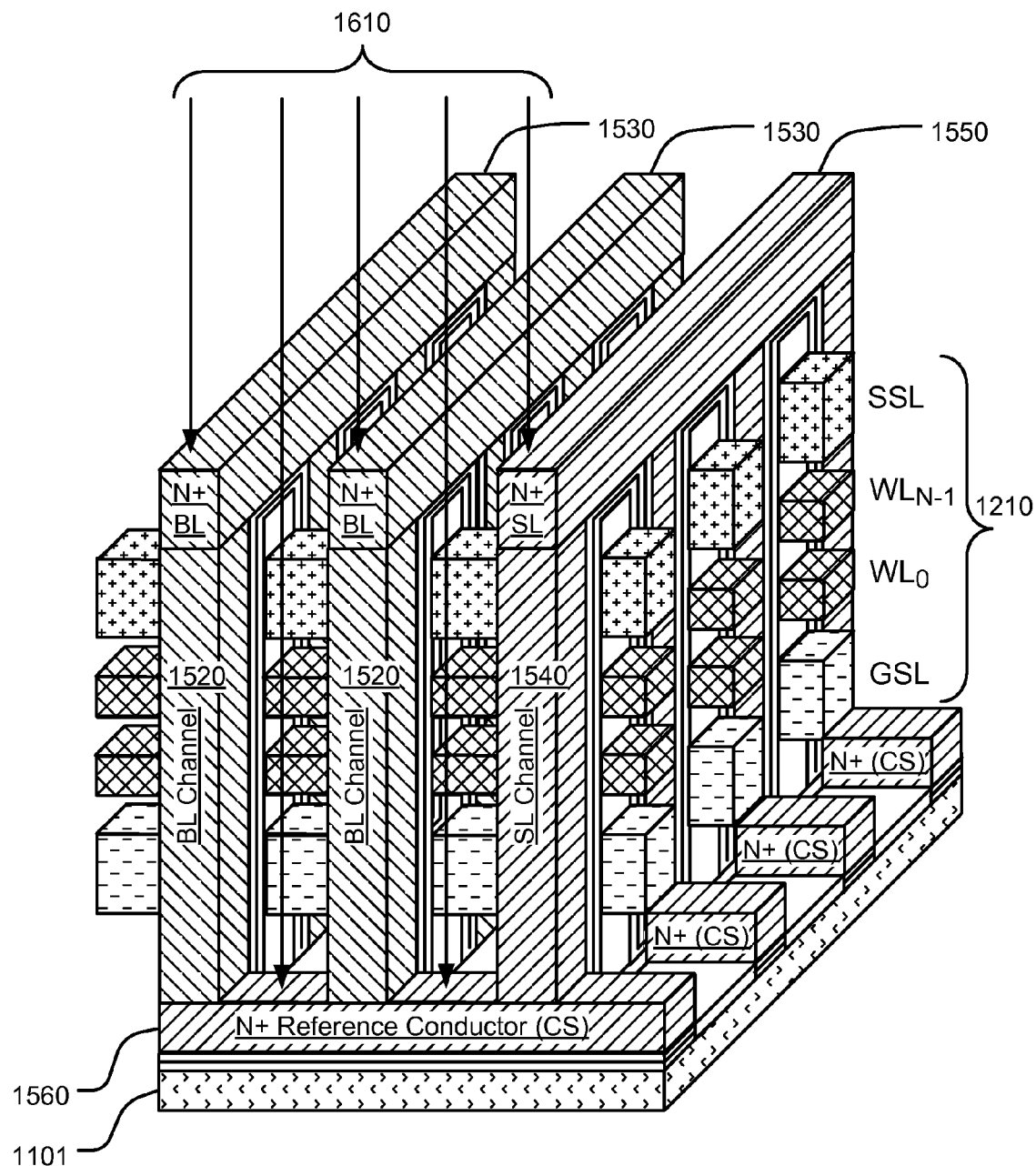

FIG. 18 illustrates a stage of the process flow after the bit line structures are formed, where the process includes implanting N+ doping material in the direction shown by arrows 1610, with a first energy level, on the linking elements 1530 in the plurality of bit line structures, the reference conductor 1560 in exposed areas between the bit line structures, and between the bit line structure and the reference line structure, and the linking elements 1550 in the at least one reference line structure. The first energy level can be less than 30 keV, with a typical dose around 1E14 per cm$^2$.

If the profile of the inter-stack semiconductor body elements 1520 of the bit line structures is sufficiently vertical (nearly 90 degrees) to the reference conductor 1560, sidewalls of the inter-stack semiconductor body elements 1520 of the bit line structures receive a minimal amount of the N+ doping material with the first energy level, while most of the N+ doping material is implanted into the reference conductor 1560, reducing its resistance accordingly.

Figure 19:
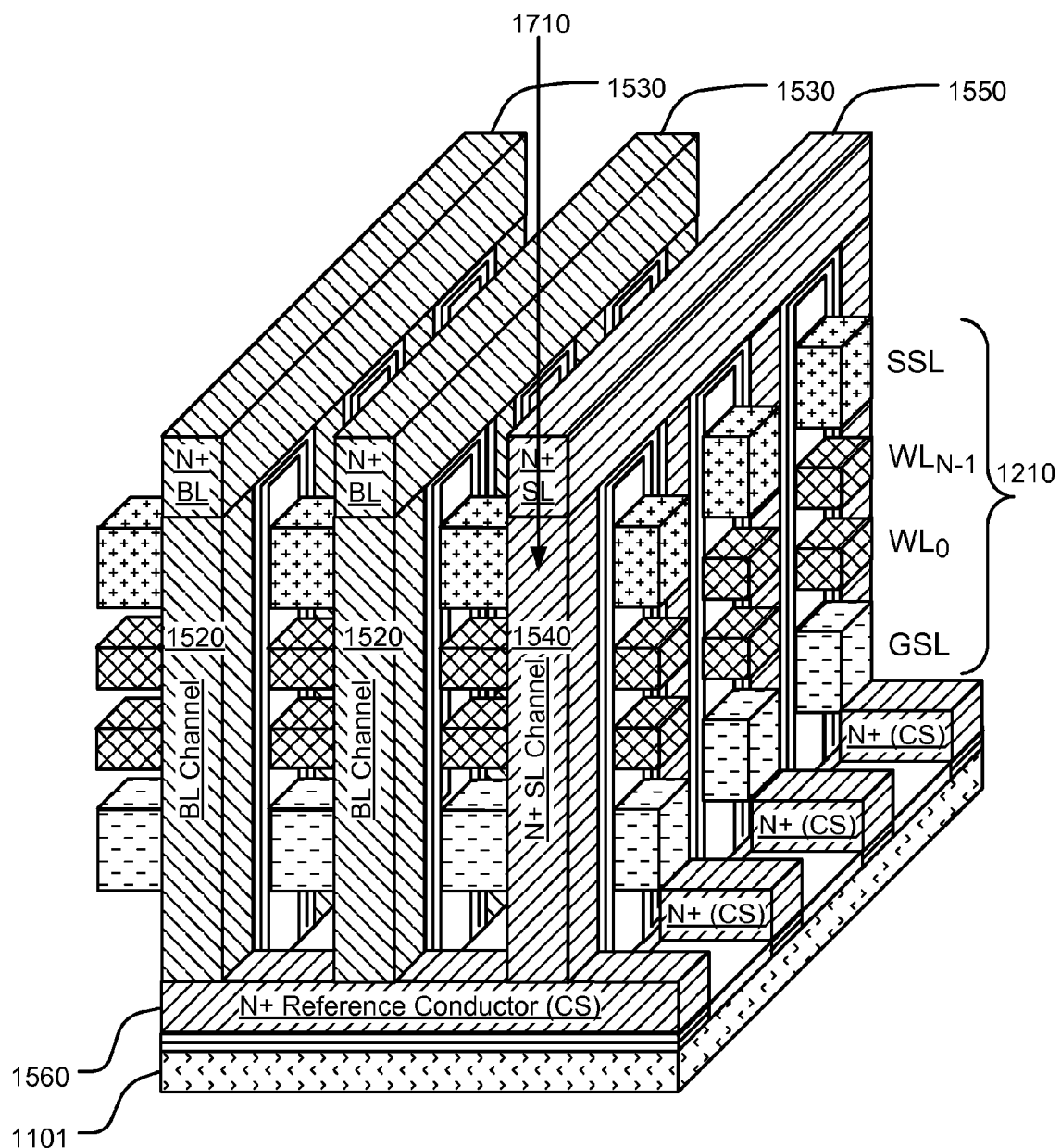

FIG. 19 illustrates a stage of the process flow following the implant of FIG. 16, where the process flow includes an additional step of implanting N+ doping material in the direction shown by arrow 1710, with a second energy level, on the inter-stack vertical conductive elements 1540 of the at least one reference line structure, wherein the second energy level is higher than the first energy level. For instance, the second energy level can be around 30 to 50 keV, with a typical dose around 1E14 to 1E15 per cm$^2$. An implant mask (not shown) can be used to protect the bit line structures and other parts of the memory array from this additional step of implanting. This can improve the conductivity of the inter-stack vertical conductive elements 1540 for the reference line structure.

The inter-stack vertical conductive elements 1540 in the at least one reference line structure can have a larger cross-sectional area than the inter-stack semiconductor body elements 1520 in the bit line structures, as illustrated in FIG. 2.

Figure 20:
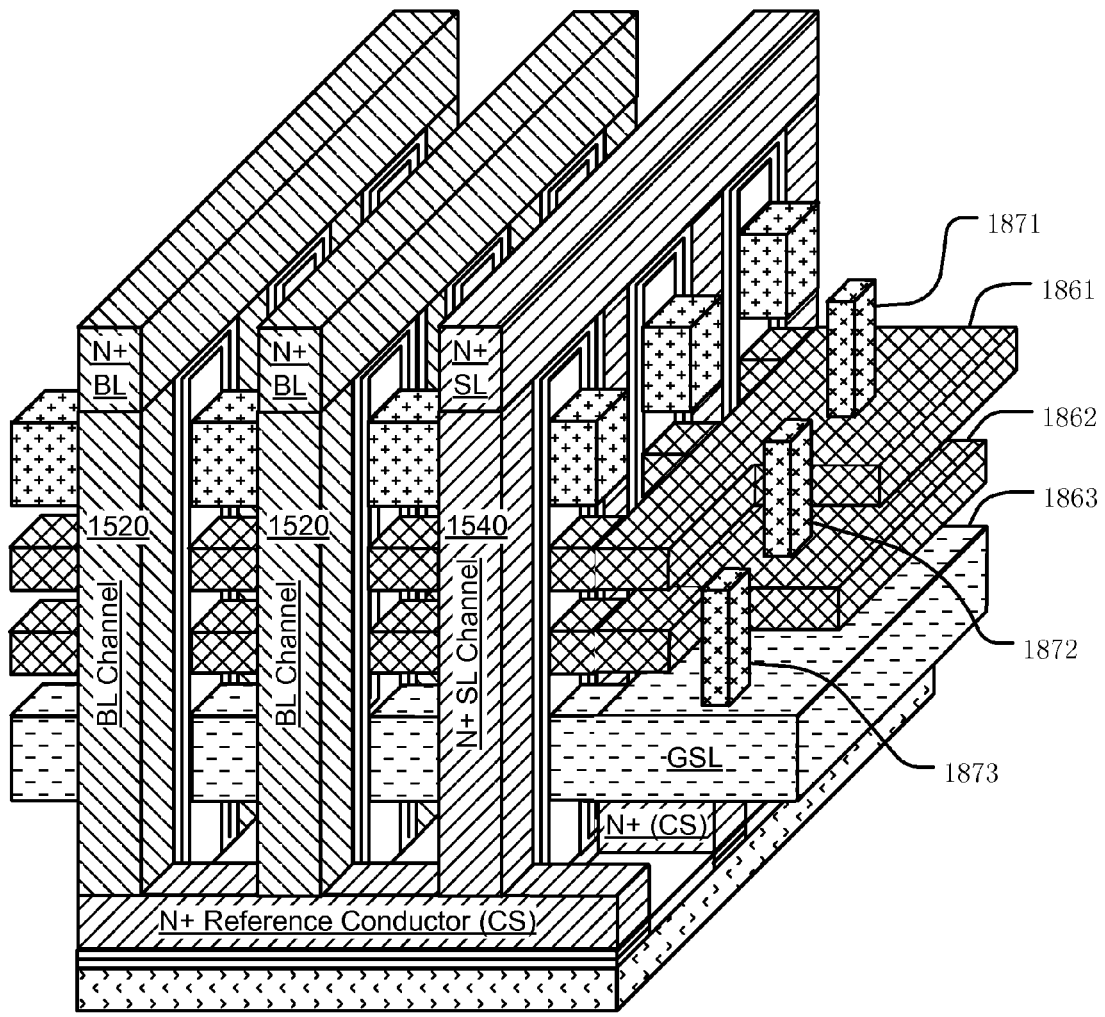

FIG. 20 illustrates a stage of the process flow following a stairstep etching process used to isolate the individual SSL lines, and to form linking elements 1861, 1862, 1863 coupled to the conductive strips in the plurality of stacks that include landing areas for interlayer connectors 1871, 1872, 1873. The pads used for linking elements 1861, 1862, 1863 can be patterned at the same time that the stacks are patterned (See, FIG. 12).

In one embodiment, the process flow can include forming blocks that include linking elements connecting sets of word lines in the intermediate planes (WLs), and interlayer connectors coupled to landing areas in the linking elements, where ends of the word lines in adjacent blocks are connected via the linking elements, and the linking elements include openings through which interlayer connectors coupled to landing areas in lower intermediate planes extend. The process flow can further include forming sidewall silicide formations on at least one side of adjacent blocks parallel to word lines in the adjacent blocks. Sidewall silicide formations can be $CoSi_x$ (cobalt silicide), $TiSi_x$ (titanium silicide), or other silicide compounds, made for example using SAlicide (self-aligned silicide) processes on sidewalls of sets of word lines.

Figure 21:
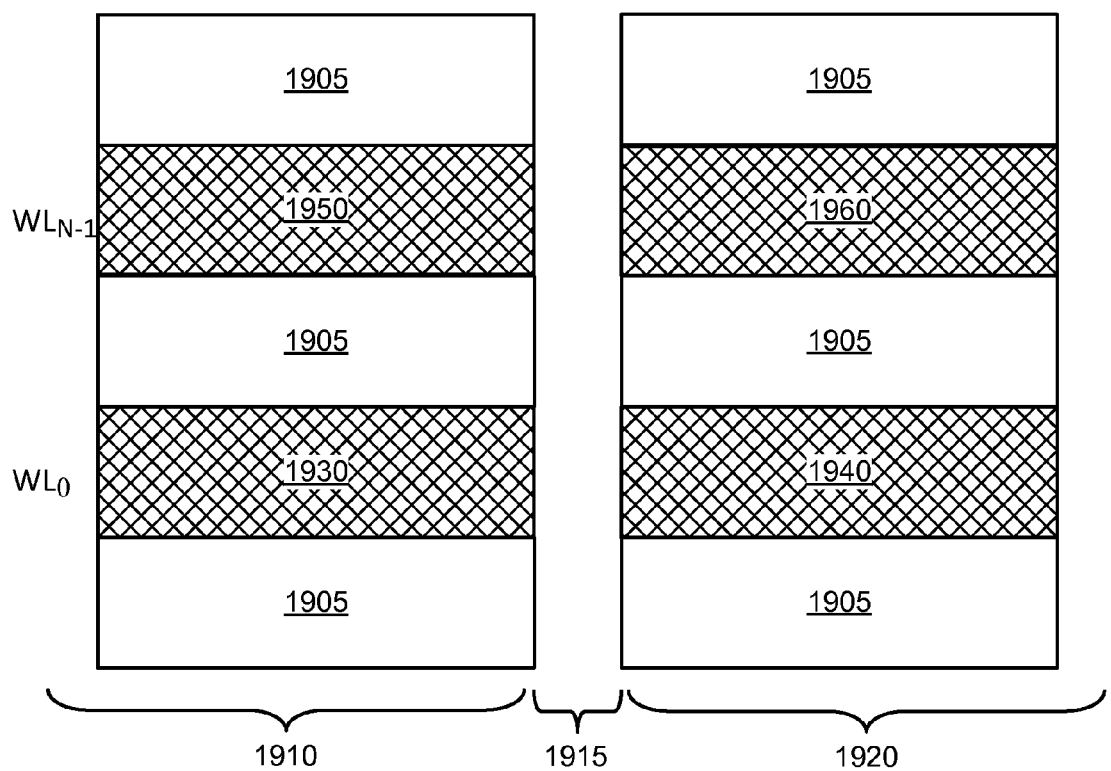
FIGS. 21 through 26 illustrate an example process flow for an embodiment in a sidewall silicide formation in a vertical channel structure.

FIGS. 21 through 26 illustrate an example process flow for an embodiment in a sidewall silicide formation in a vertical channel structure. FIG. 21 is a cross-section taken orthogonally to the conductive strips in a structure like that of FIG. 13, including the intermediate planes of conductive strips 1930, 1940, 1950, 1960 (WL0 and WLN−1) separated by insulating material 1905, after a word line slit process. The slit process can be a patterned etch used to cut conductive strips into multiple sets of word lines, exposing sidewalls of the intermediate planes WL0 and WLN−1. FIG. 21 illustrates a first set of word lines 1910, a second set of word lines 1920, and a space 1915 between the two sets.

Although the top plane of conductive strips (SSLs) and the bottom plane (GSL) of conductive strips are not shown in FIGS. 21 through 26, the process flow can include forming a sidewall silicide formation on a side of a set of string selection lines in the top plane, and on a side of a set of ground selection lines in the bottom plane.

Figure 22:
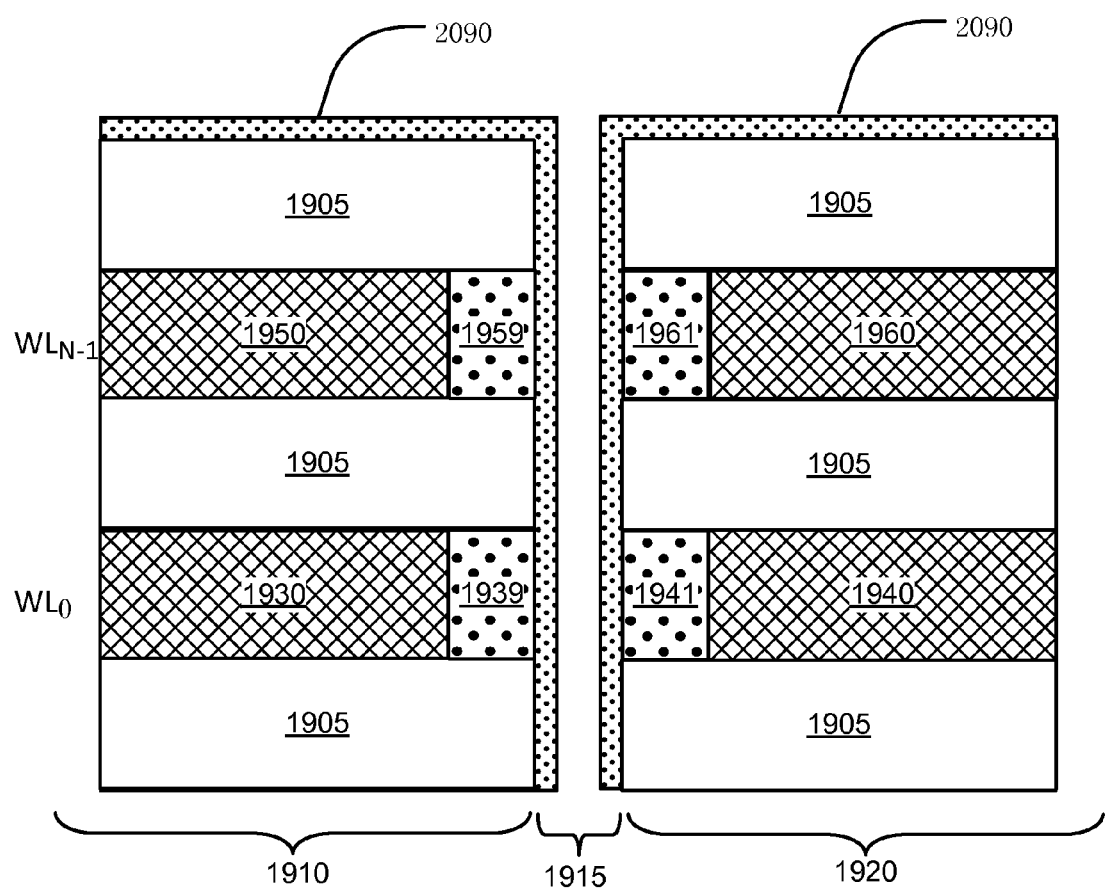

FIG. 22 illustrates a stage in the process after a procedure to form silicide on the exposed sides between the conductive strips 1930, 1940, 1950, 1960, while preventing silicide formation on the opposing sides. The silicide can be formed by depositing a thin silicide precursor, such as a transition metal layer 2090 over sidewalls of the two sets of word lines. Then the structure is annealed, causing the silicide precursor to react with the conductive material in the intermediate planes WL0 and WLN−1 to form low-resistance sidewall silicide formations, such as sidewall silicide formations 1939 and 1959 for the first set of word lines 1910, and sidewall silicide formations 1941 and 1961 for the second set of word lines 1920.

Figure 23:
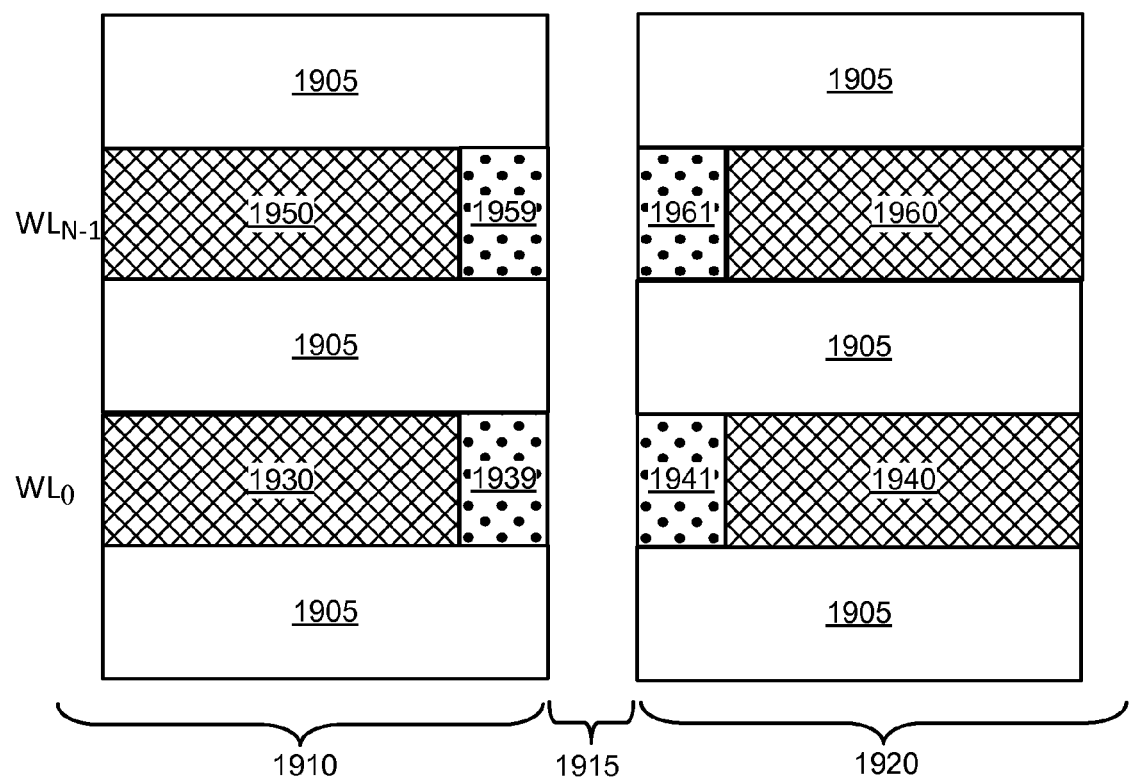

As shown in FIG. 23, after the reaction to form the sidewall silicide formations 1939, 1959, 1941 and 1961, remaining or excess transition metal is etched away.

Figure 24:
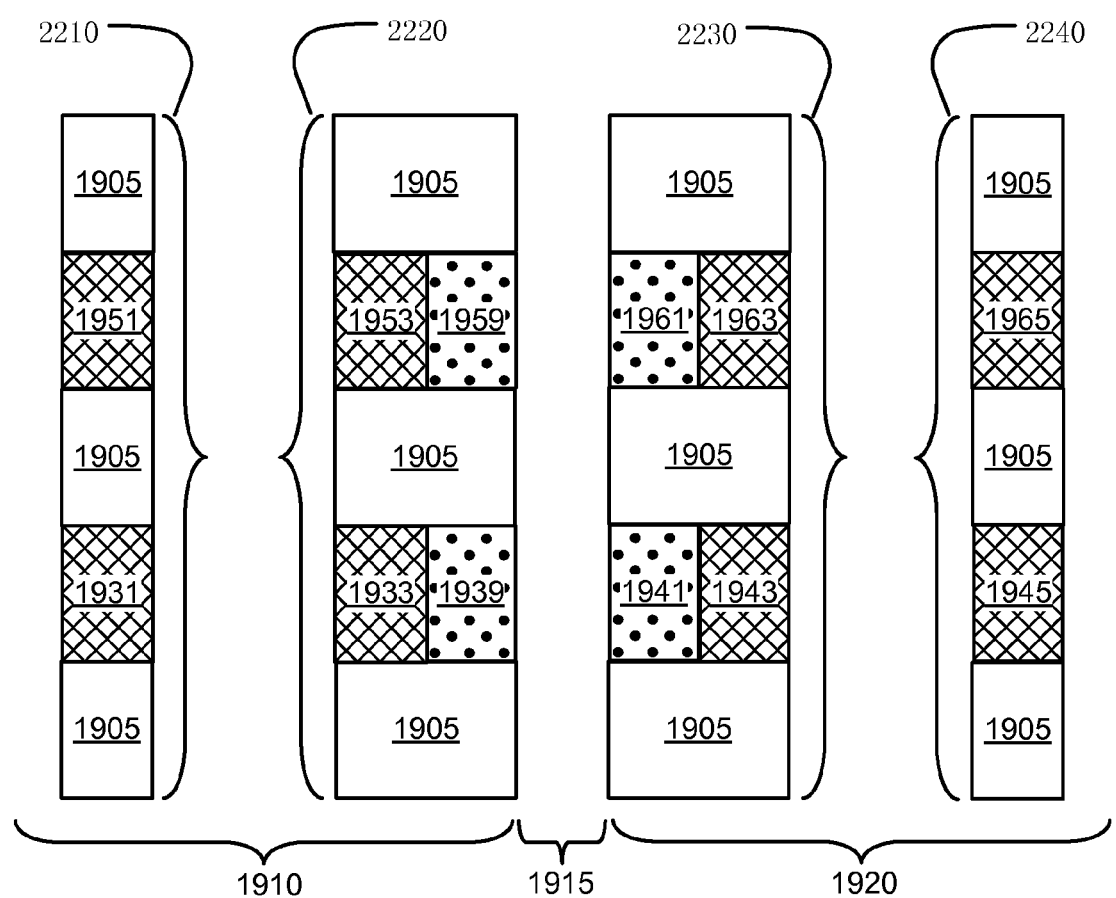

FIG. 24 illustrates a stage in the process after etching the plurality of layers to divide the conductive strips 1930, 1940, 1950, 1960, forming divided strips 1931, 1933, 1943, 1945, 1951, 1953, 1963, and 1965. The divided strips define a plurality of stacks of conductive strips, such as stacks 2210 and 2220 for the first set of word lines 1910, and stacks 2230 and 2240 for the second set of word lines 1920. The stacks include at least a bottom plane (GSL) of conductive strips (not shown), a plurality of intermediate planes (WLs) of conductive strips, and a top plane of conductive strips (SSLs) (not shown). The plurality of intermediate planes can include N planes, ranging from 0 to N−1.

Figure 25:
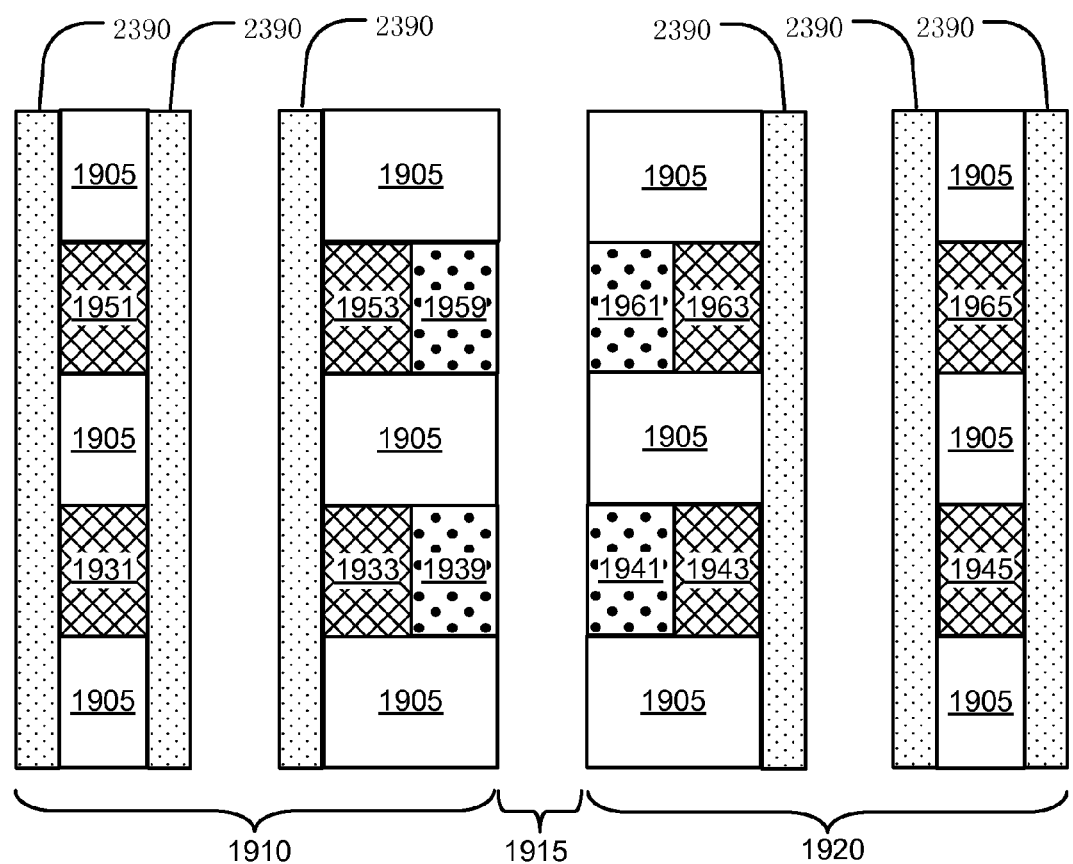

FIG. 25 illustrates a stage in the process after forming a memory layer 2390 on side surfaces of conductive strips in the plurality of stacks, in regions not covered by the sidewall silicide formations 1939, 1959, 1941 and 1961. The memory layer 2390 contacts side surfaces of the plurality of conductive strips.

Figure 26:
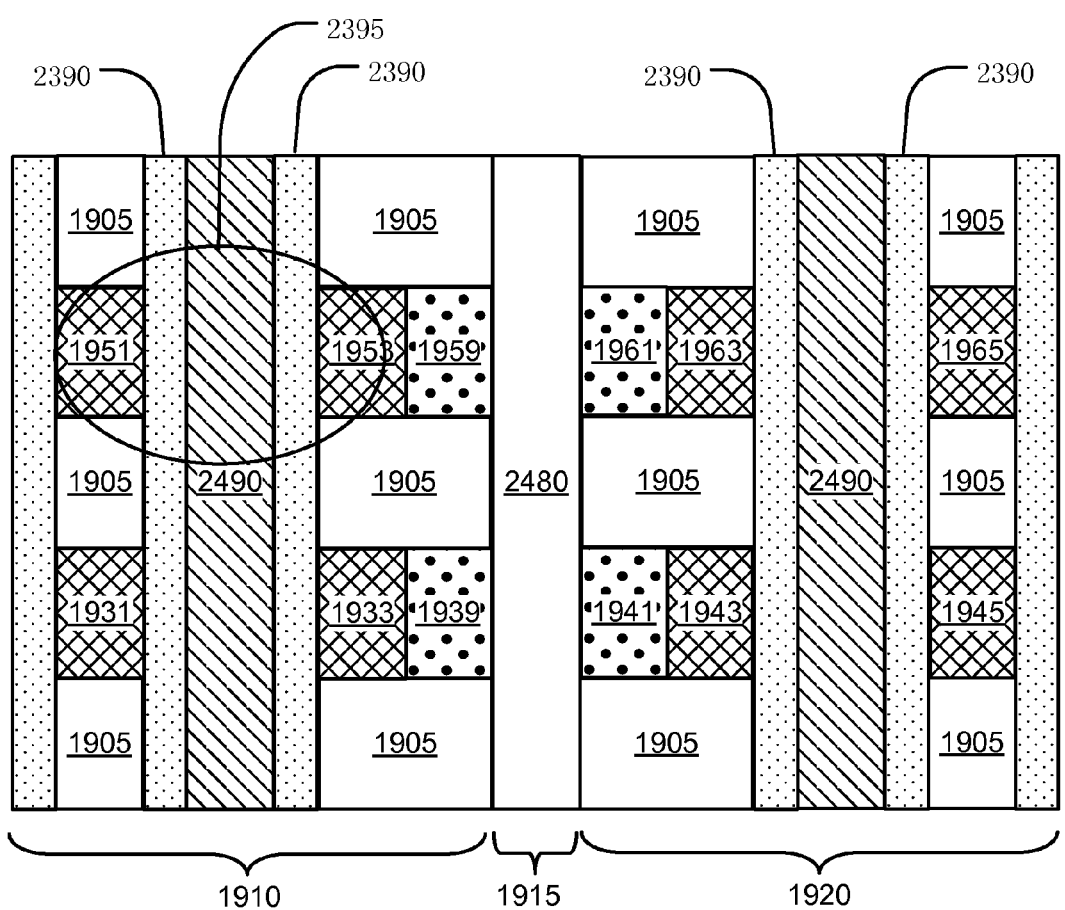

FIG. 26 illustrates a stage in the process after forming a layer of a second conductive material to form a vertical inter-stack semiconductor body element 2490, acting as a vertical channel structure over, and having a surface conformal with, the memory layer 2390 on the plurality of stacks. The space 1915 between the two sets of word lines can be filled with insulation material 2480 at some position in the process flow. A double gate flash memory cell (region 2395) results, having two multibit charge storage sites in the frustum between cross-points of the conductive strips 1951 and 1953 with the vertical inter-stack semiconductor body element 2490, and at other similar cross-points, to form a 3D memory array. The process flow can then continue as described above.

Figure 27:
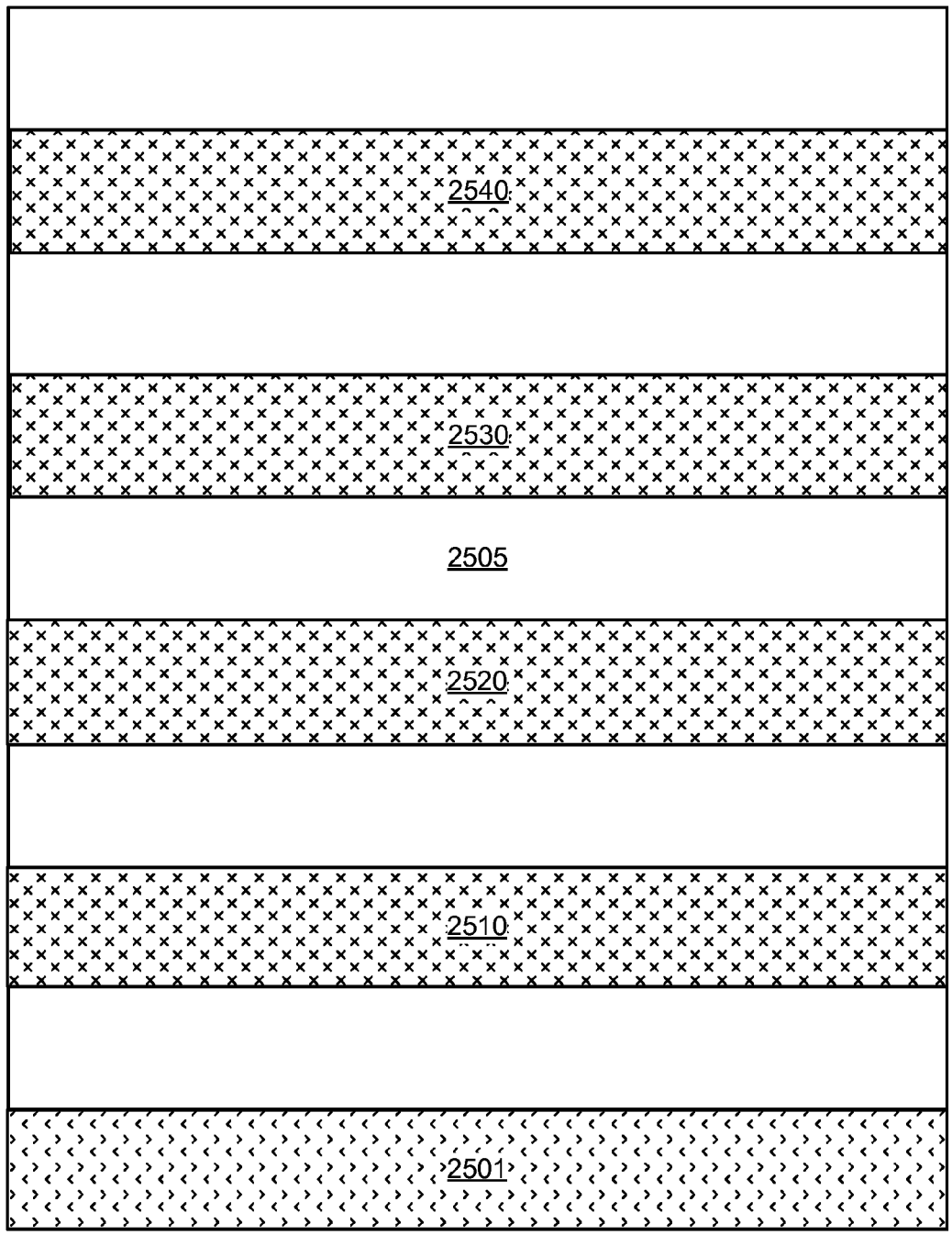
FIGS. 27 through 35 illustrate an example process flow for an alternative embodiment in a sidewall silicide formation in a vertical channel structure.

FIGS. 27 through 35 illustrate an example process flow for an alternative embodiment in a sidewall silicide formation in a vertical channel structure. In the alternative embodiment, charge storage structures are disposed in interface regions at cross-points between side surfaces of a first side of word lines in the intermediate planes (WLs) and the inter-stack semiconductor body elements in the plurality of bit line structures, and sidewall silicide formations are disposed on side surfaces of a second side of the word lines opposite the first side in the intermediate planes (WLs) of conductive strips in the pairs of adjacent stacks. FIG. 27 illustrates a cross-section of a partially fabricated memory device. In the example shown in FIG. 27, the memory device includes a reference conductor layer 2501, and a plurality of sacrificial layers, including sacrificial layers 2510, 2520, 2530 and 2540, separated by insulating material 2505.

Figure 28:
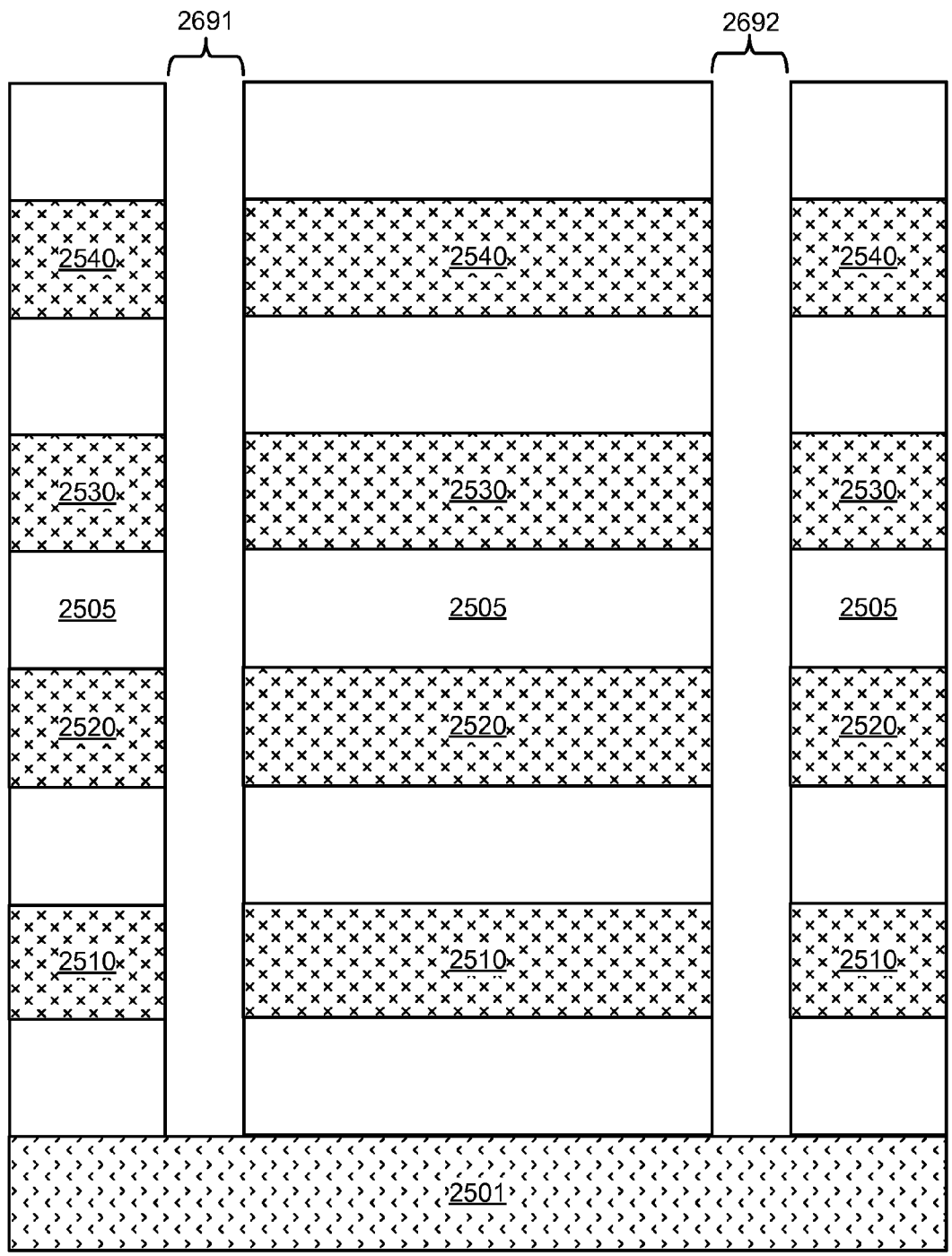

FIG. 28 illustrates a stage in the process after etching the plurality of sacrificial layers to define a plurality of pairs of adjacent stacks, by forming openings 2691 and 2692 etched through the plurality of sacrificial layers. The openings 2691 and 2692 are used to form the inter-stack semiconductor body elements used as vertical channel structures shared by the pairs of adjacent stacks.

Figure 29:
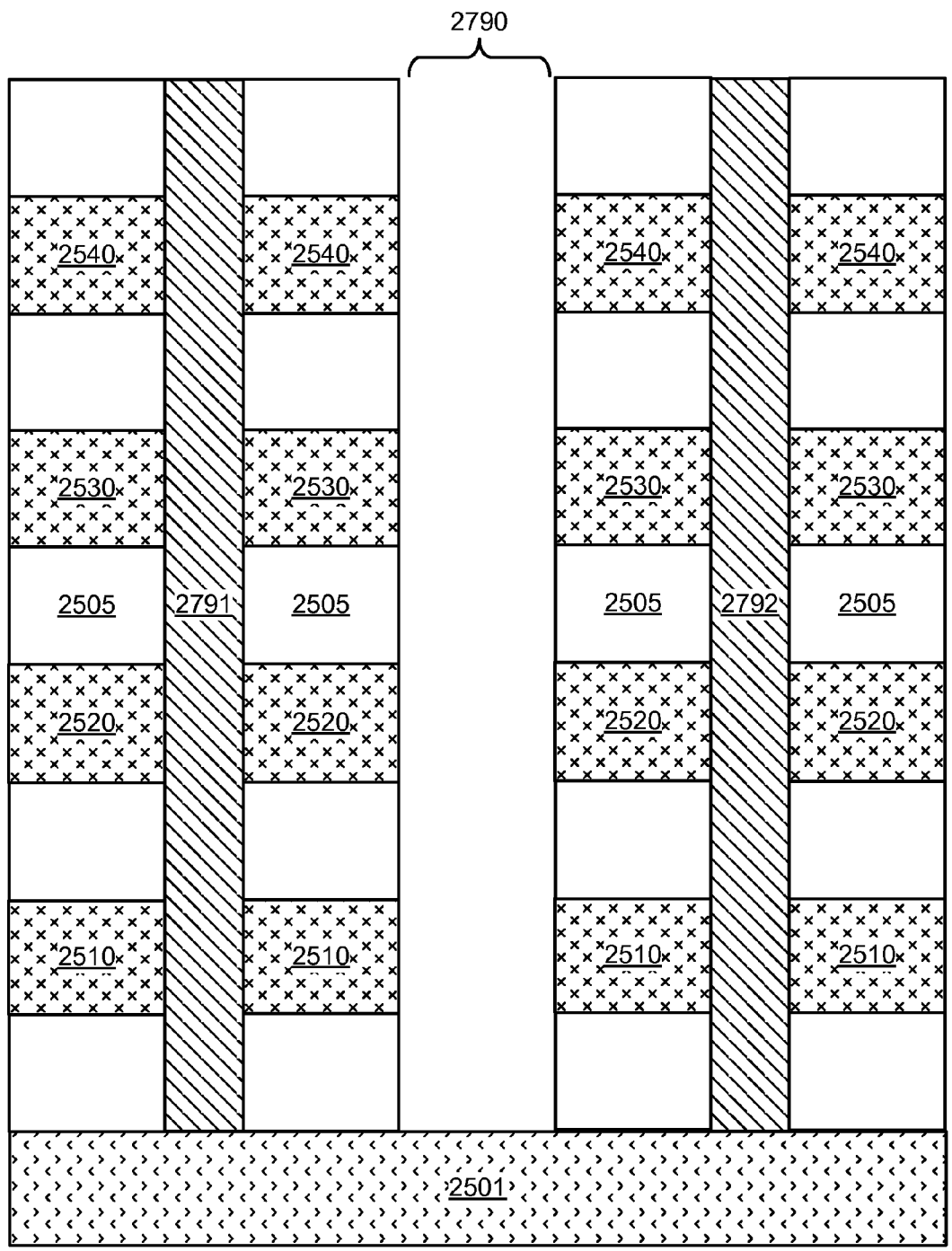

FIG. 29 illustrates a stage in the process after forming the inter-stack semiconductor body elements 2791 and 2792 that act as vertical channel structures in openings 2691 and 2692, respectively, using the second conductive material, and etching openings, such as an opening 2790 extending to the reference conductor layer 2501, to expose sacrificial layers 2510, 2520, 2530 and 2540, and to separate pairs of adjacent stacks.

Figure 30:
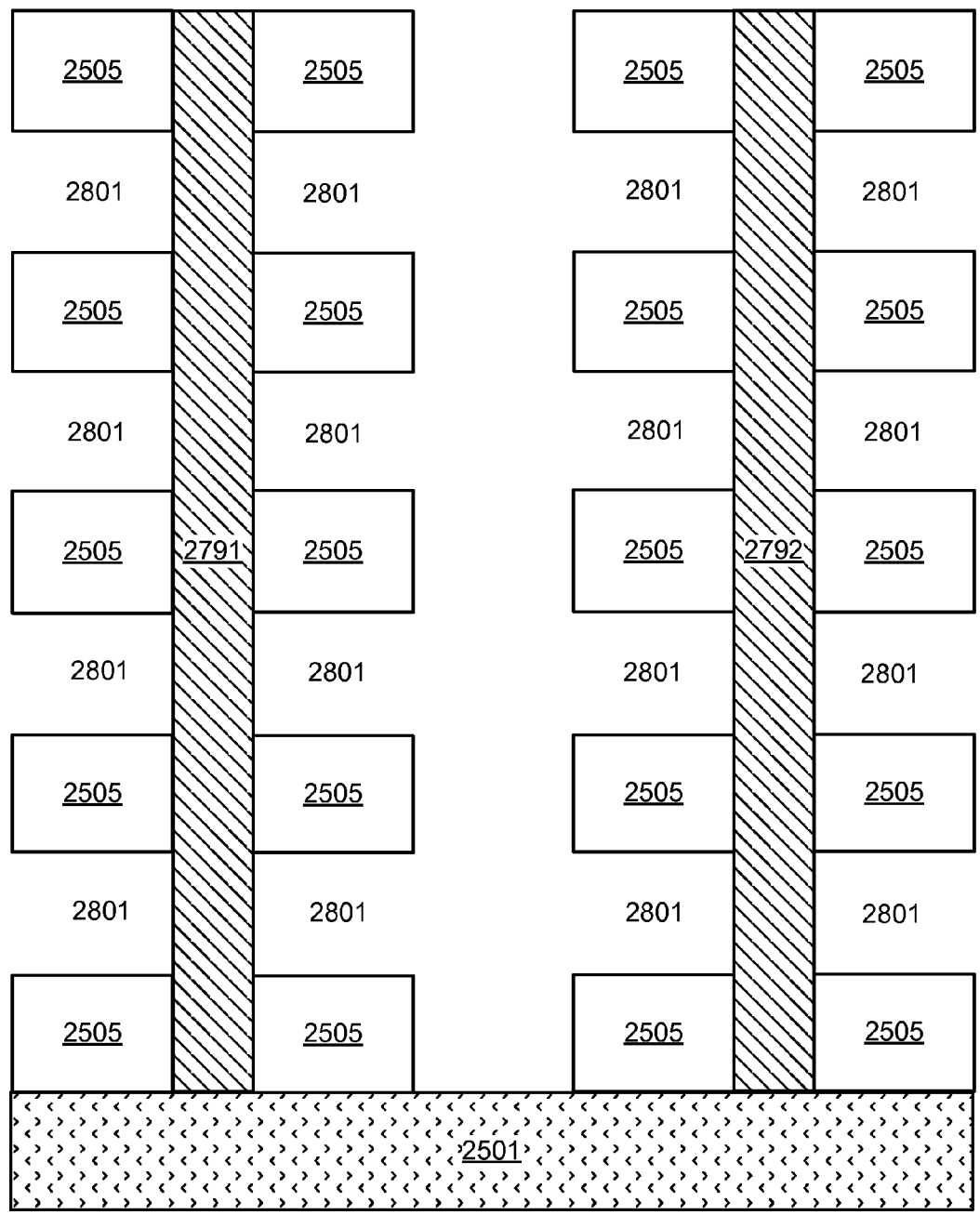

FIG. 30 illustrates a stage in the process after removing sacrificial layers 2510, 2520, 2530 and 2540 exposed by the openings such as the opening 2790. This etch process leaves layers of insulating material 2505 in the respective stacks adhered to the second conductive material that acts as the inter-stack semiconductor body elements, with openings (e.g. 2801) in between.

Figure 31:
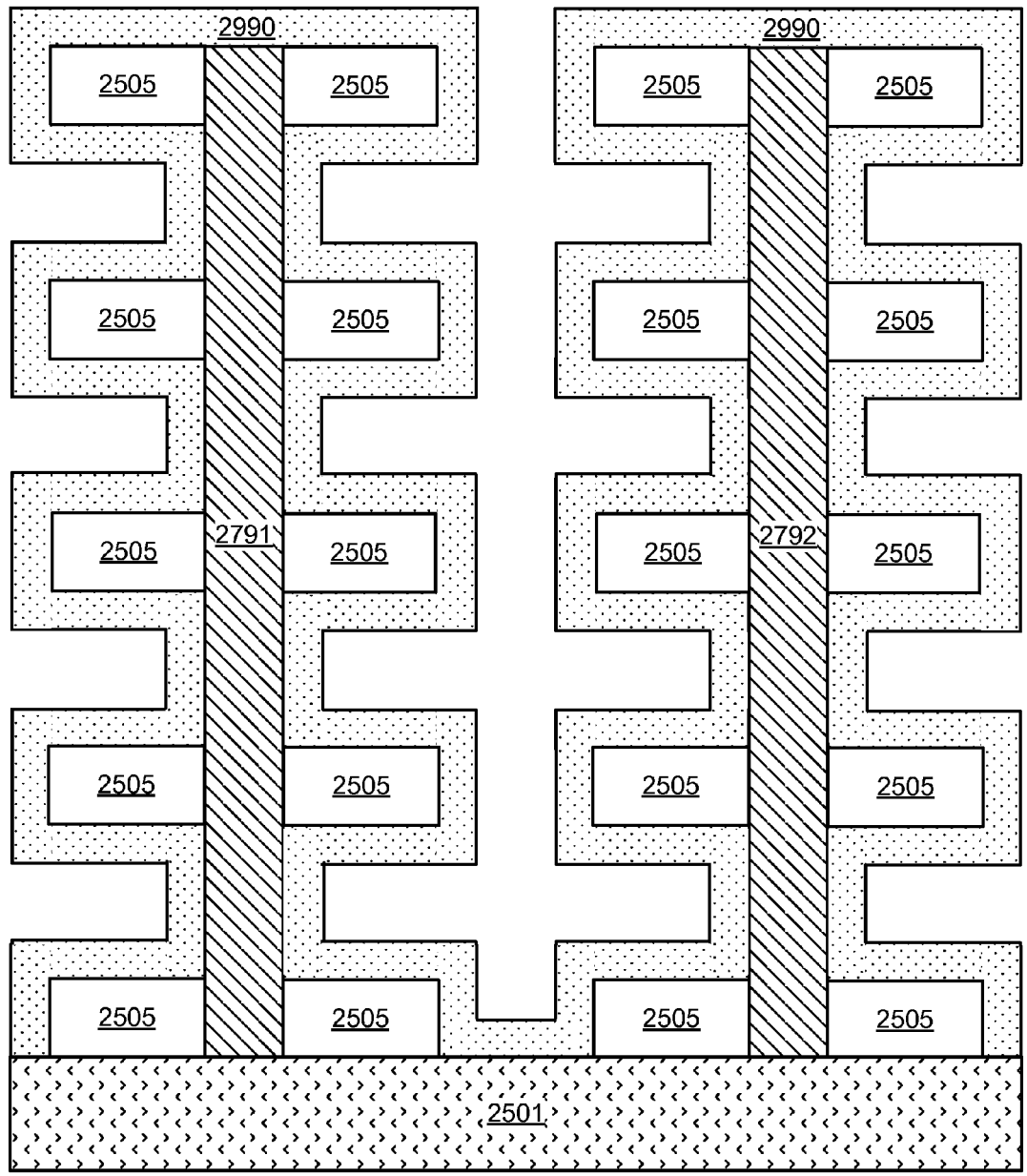

FIG. 31 illustrates a stage in the process after forming a memory layer 2990 on side surfaces of the inter-stack semiconductor body elements 2791 and 2792. The memory layer 2990 can include a multilayer dielectric charge storage structure, known from flash memory technologies, including for example flash memory technologies known as SONOS, BE-SONOS, TANOS, and MA BE-SONOS.

Figure 32:
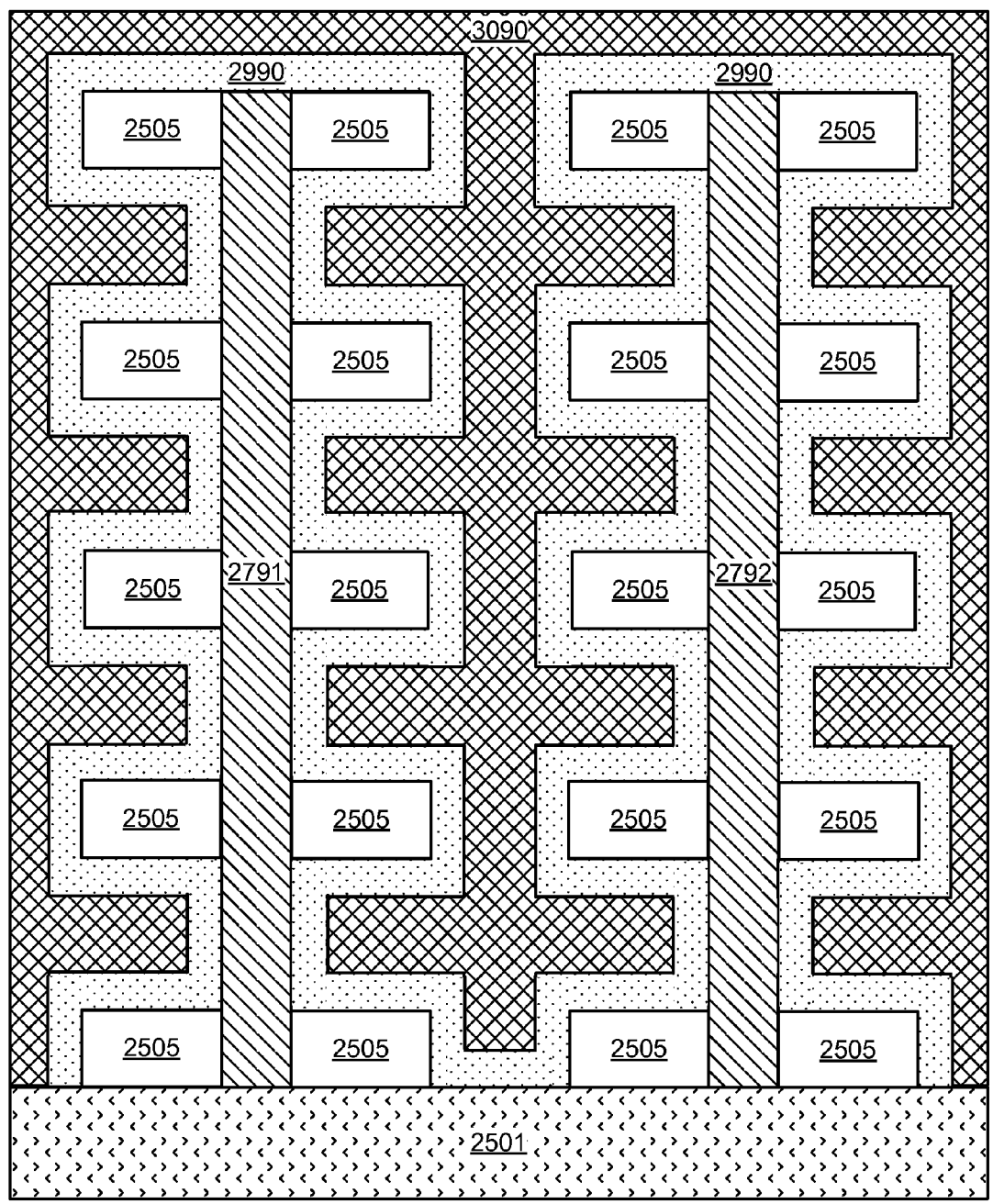

FIG. 32 illustrates a stage in the process after forming a plurality of layers of the first conductive material 3090 between and over pairs of adjacent stacks, filling the openings left by removal of the sacrificial layers between layers of insulating material 2505, and over the memory layer 2990.

Figure 33:
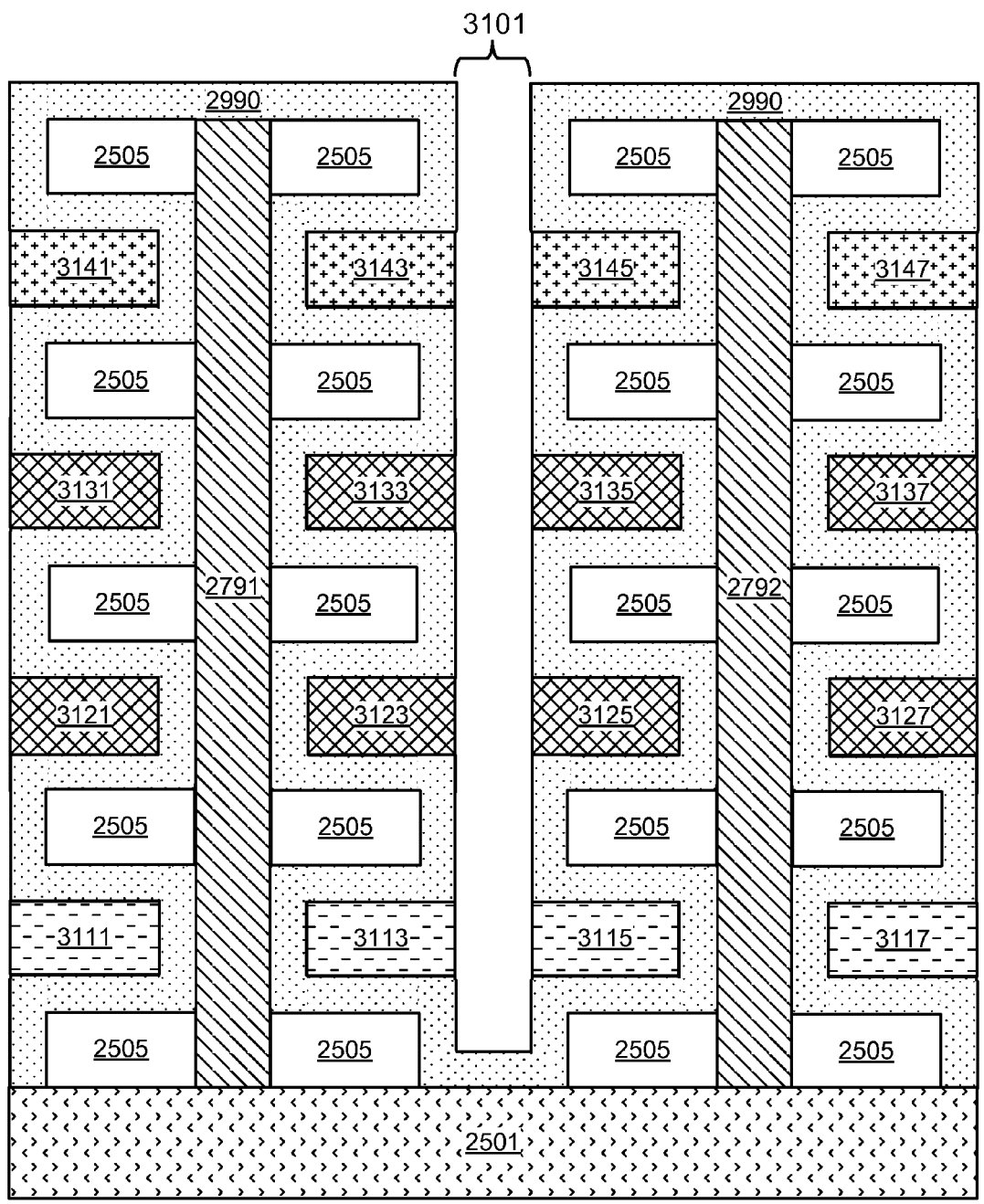

FIG. 33 illustrates a stage in the process after etching trenches (e.g. 3101) between the stacks of conductive strips, removing excess material in the layers of the first conductive material 3090 to define stacks including at least a bottom plane (GSL) of conductive strips 3111, 3113, 3115, and 3117, a plurality of intermediate planes (WLs) of conductive strips 3121, 3123, 3125, and 3127, and conductive strips 3131, 3133, 3135, and 3137, and a top plane of conductive strips (SSLs) 3141, 3143, 3145, and 3147.

Figure 34:
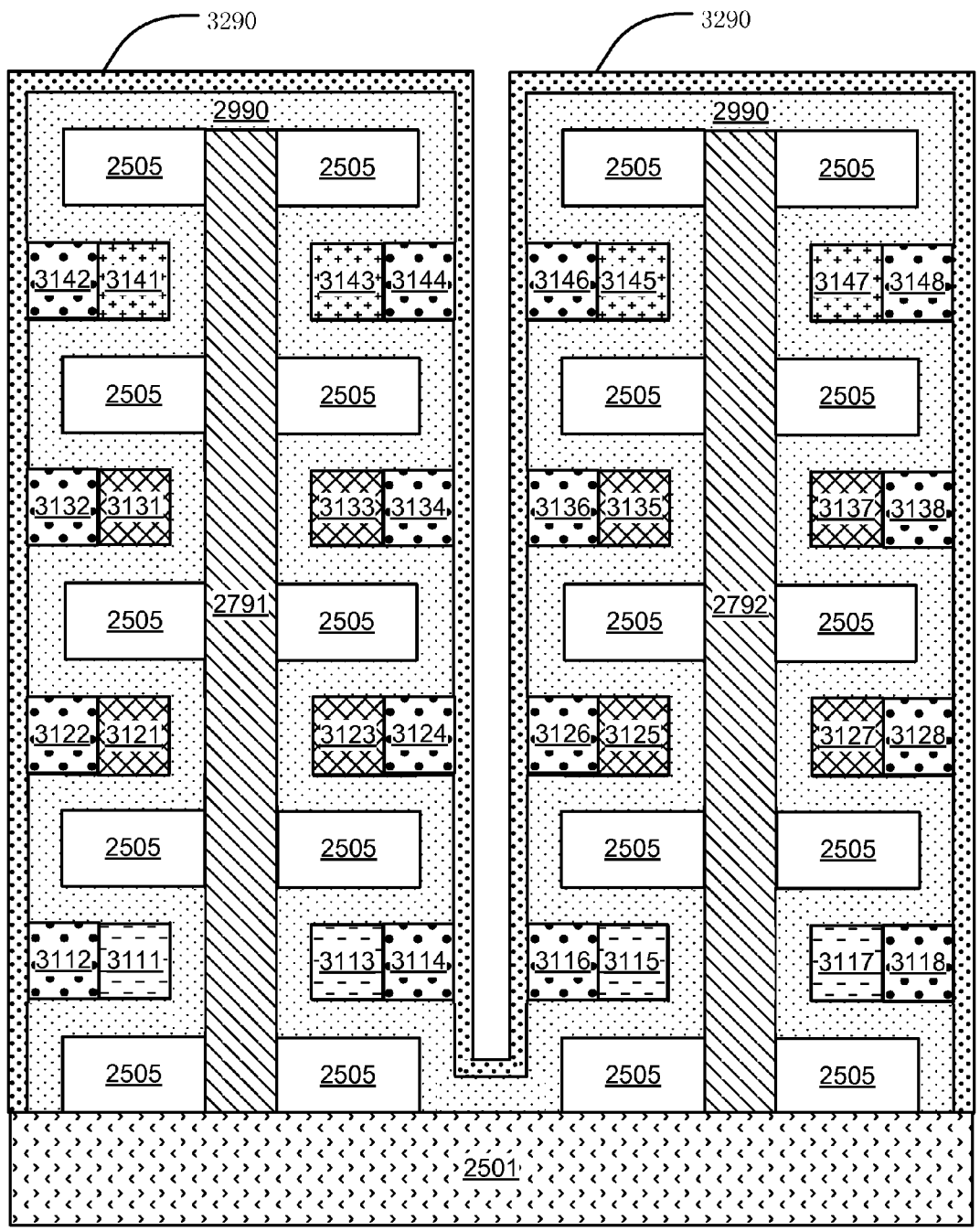

FIG. 34 illustrates a stage in the process after a process to form silicide on the sidewalls of the conductive strips 3111, 3113, 3115, and 3117, 3121, 3123, 3125, and 3127, 3131, 3133, 3135, and 3137, and 3141, 3143, 3145, and 3147, where the conductive strips comprise a silicon-containing material. The silicide process includes depositing a thin silicide precursor, such as a transition metal layer 3290, over sidewalls of the pairs of adjacent stacks. The silicide precursor is then annealed, to cause it to react with the silicon in the conductive strips 3111, 3113, 3115, and 3117, 3121, 3123, 3125, and 3127, 3131, 3133, 3135, and 3137, and 3141, 3143, 3145, and 3147, to form low-resistance sidewall silicide formations, such as sidewall silicide formations 3122, 3124, 3126, and 3128, silicide formations 3132, 3134, 3136, and 3138, and sidewall silicide formations 3142, 3144, 3146, and 3148, and sidewall silicide formations 3112, 3114, 3116, and 3118.

Figure 35:
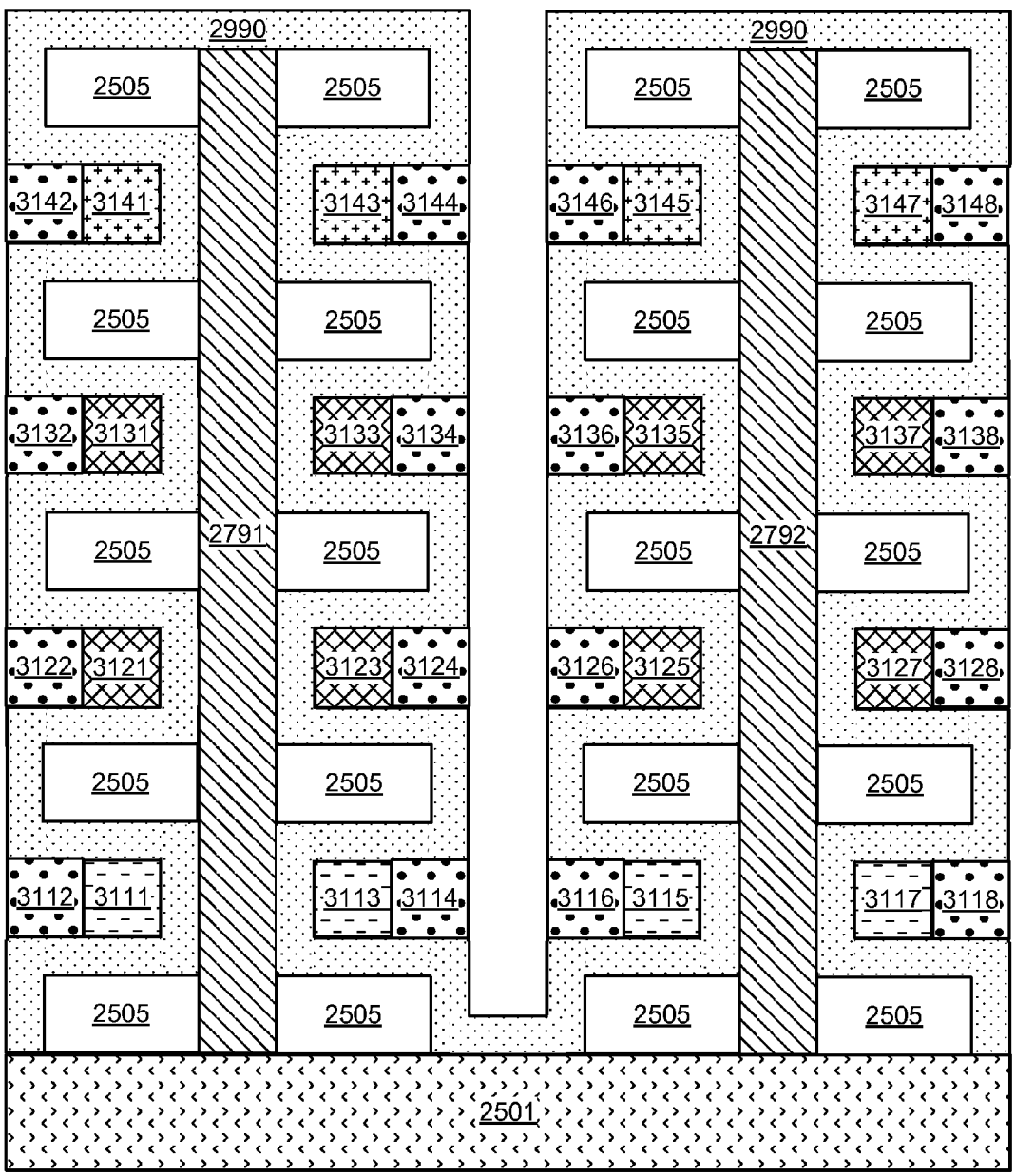

FIG. 35 illustrates a stage in the process after etching away any excess silicide precursor. The manufacturing process continues as described above, for example, to complete a 3D memory array, with double gate, multiple-bit-per-cell, vertical NAND strings.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device including a 3D array of memory cells, the device comprising:
a plurality of stacks of conductive strips, the plurality of stacks including even stacks and odd stacks having sidewalls, at least some of the conductive strips in the stacks configured as word lines;
even and odd data storage structures on the sidewalls of the respective even and odd stacks; and
a plurality of vertical channel structures between corresponding even and odd stacks of conductive strips in the plurality of stacks, each vertical channel structures in the plurality comprising one even semiconductor film and one odd semiconductor films having outside surfaces and inside surfaces, the outside surfaces of the even semiconductor films disposed on the even data storage structures forming even memory cells in the 3D array of memory cells, the outside surfaces of the odd semiconductor films disposed on the odd data storage structures forming odd memory cells in the 3D array of memory cells, the inside surfaces facing each other and separated.

2. The memory device of claim 1, wherein vertical channel structures in the plurality of vertical channel structures include a gap separating the even and odd semiconductor films.

3. The memory device of claim 1, including control circuitry configured to apply a bias arrangement in which different bias voltages are applied to the conductive strips in the even stacks than are applied to the conductive strips in the odd stacks.

4. The memory device of claim 1, wherein memory cells along the even semiconductor films on the sidewalls of the even stacks are configured as NAND strings accessible by the conductive strips in the even stacks, and memory cells along the odd semiconductor films on the sidewalls of the odd stacks are configured as NAND strings accessible by the conductive strips in the odd stacks.

5. The memory device of claim 1, wherein the data storage structure comprises a multilayer dielectric charge trapping structure.

6. The memory device of claim 1, including a reference conductor below the plurality of stacks of conductive strips, and wherein in a vertical channel structure in the plurality of vertical channel structures, the even and odd semiconductor films terminate in electrical contact with the reference conductor.

7. The memory device of claim 6, wherein the stacks of conductive strips include upper levels configured as string select lines, and lower levels configured as ground select lines.

8. The memory device of claim 6, including one or more patterned conductor layers over the plurality of stacks, including bit lines, and interlayer connectors connecting the bit lines to the even and odd semiconductor films in corresponding vertical channel structures.

9. The memory device of claim 6, wherein the reference conductor comprises a layer of semiconductor material below the plurality of stacks.

10. The memory device of claim 6, including a patterned interlayer connector disposed beside the plurality of stacks, and connected to the reference conductor.

11. The memory device of claim 1, wherein the plurality of stacks of conductive strips are arranged in blocks, and in a given block, conductive strips in a given layer of an odd stack are configured in a comb-like structure with strips extending from an odd pad, and conductive strips in the given layer of an even stack are configured in a comb-like structure with strips extending from an even pad, the conductive strips extending from the odd and even pads in the given block being interdigitated.

12. A memory device, comprising:
a plurality of stacks of horizontal conductive strips, the plurality of stacks including even stacks and odd stacks;
a plurality of active pillars arranged between corresponding even and odd stacks of horizontal conductive strips in the plurality of stacks, defining a multi-layer array of interface regions at cross-points between opposing side surfaces of the active pillars and horizontal conductive strips in the corresponding even and odd stacks of conductive strips,
wherein the active pillars comprise vertical channel structures, the vertical channel structures having upper levels, intermediate levels, and lower levels,
wherein at the intermediate levels the vertical channel structures comprise first active pillar portions and second active pillar portions separated by a seam; and
a 3D array of even memory cells in the interface regions accessible via the first active pillar portions and conductive strips in the even stacks of conductive strips, and odd memory cells in the interface regions accessible via the second active pillar portions and conductive strips in the odd stacks of conductive strips.

13. The memory device of claim 12, wherein horizontal conductive strips in the plurality of stacks at the intermediate levels of the vertical channel structures are configured as word lines.

14. The memory device of claim 12, wherein at the upper levels of the vertical channel structures there is no seam.

15. The memory device of claim 14, wherein horizontal conductive strips in the plurality of stacks at the upper levels of the vertical channel structures are configured as string select lines.

16. The memory device of claim 12, wherein the even memory cells accessible via a given first active pillar portion are configured as a first NAND string, and the odd memory cells accessible via a given second active pillar portion are configured as a second NAND string.

17. The memory device of claim 12 wherein a given memory cell comprises a charge storage structure.

18. The memory device of claim 17 where the charge storage structure comprises a multilayer dielectric charge trapping structure.

19. The memory device of claim 12 wherein horizontal conductive strips in the plurality of stacks at the lower levels of the vertical channel structures are configured as ground select lines.

20. The memory device of claim 19 wherein the active pillars are arranged in rows, and further comprising a plurality of reference lines beneath and connected to the rows of active pillars, wherein the conductive strips configured as ground select lines have a thickness such that they overlap with corresponding reference lines and with lower portions of the active pillars in the corresponding rows.

21. The memory device of claim 12 further comprising control circuitry configured to apply different bias voltages to the even and odd horizontal conductive strips, and execute a program operation by which more than one bit of data is stored in at least one of the even memory cells and odd memory cells in a given frustum of a selected active strip.

22. The memory device of claim 12 wherein the plurality of stacks of conductive strips are arranged in blocks, and in a given block, conductive strips in a given layer of an odd stack are configured in a comb-like structure with strips extending from an odd pad, and conductive strips in the given layer of an even stack are configured in a comb-like structure with strips extending from an even pad, the conductive strips extending from the odd and even pads in the given block being interdigitated.

* * * * *